(12) United States Patent
Heidari et al.

(10) Patent No.: US 7,854,873 B2
(45) Date of Patent: *Dec. 21, 2010

(54) IMPRINT STAMP COMPRISING CYCLIC OLEFIN COPOLYMER

(75) Inventors: Babak Heidari, Furulund (SE); Marc Beck, Malmö (SE); Matthias Keil, Malmö (SE)

(73) Assignee: Obducat AB, Malmo (SE)

( * ) Notice: Subject to any disclaimer, the term of this patent is extended or adjusted under 35 U.S.C. 154(b) by 671 days.

This patent is subject to a terminal disclaimer.

(21) Appl. No.: 11/450,377

(22) Filed: Jun. 12, 2006

(65) Prior Publication Data

US 2007/0212522 A1    Sep. 13, 2007

Related U.S. Application Data

(60) Provisional application No. 60/595,154, filed on Jun. 10, 2005.

(30) Foreign Application Priority Data

Jun. 10, 2005 (EP) .................................. 05105100
Nov. 3, 2005 (EP) .................................. 05110290

(51) Int. Cl.
B29C 59/02 (2006.01)
(52) U.S. Cl. ................. 264/225; 264/220; 264/320; 264/496; 264/239; 264/299; 264/219
(58) Field of Classification Search ................ 264/496, 264/320, 239, 299, 219, 220, 225; 428/141, 428/411.1
See application file for complete search history.

(56) References Cited

U.S. PATENT DOCUMENTS 2,883,372 A    4/1959  Stamatoff
5,334,424 A    8/1994  Hani et al.
5,459,213 A *  10/1995 Kelsey ........................ 526/133
5,772,905 A    6/1998  Chou
6,334,960 B1   1/2002  Willson et al.

(Continued)

FOREIGN PATENT DOCUMENTS

| DE | 3714011 A1 | 2/1988 |
| EP | 0 405 843 A2 | 1/1991 |
| EP | 0 813 255 A | 12/1997 |
| EP | 0 813 255 A1 | 12/1997 |
| EP | 1 127 912 A1 | 8/2001 |

(Continued)

OTHER PUBLICATIONS

J.Y. Shin et al., IUPAC Technical Report "Chemical Structure and Physical Properties of Cyclic Olefin Copolymers," Pure Appl. Chem., vol. 77, No. 5, 2005, pp. 801-814, DOI: 10.1351/pac200577050801.

(Continued)

*Primary Examiner*—Khanh Nguyen
*Assistant Examiner*—Saeed M Huda
(74) *Attorney, Agent, or Firm*—Renner, Otto, Boisselle & Sklar, LLP

(57) ABSTRACT

A method is provided for transferring a pattern from a template (1) to an object (12) in an imprint process, using a two-step process. The first step includes contacting a pattern of the template surface with a polymer material comprising one or more Cyclic Olefin Copolymers (COCs), to produce a flexible polymer replica having a structured surface with an inverse of the pattern of the template surface. In a second step, after releasing the flexible polymer replica from the template, the inverse pattern of the flexible polymer replica is pressed into a resist layer on a substrate, to imprint a replica of the pattern of the template surface in therein.

27 Claims, 9 Drawing Sheets

U.S. PATENT DOCUMENTS

| | | |
|---|---|---|
| 6,953,332 B1 * | 10/2005 | Kurk et al. ................ 425/275 |
| 2001/0031802 A1 | 10/2001 | Murschall et al. |
| 2002/0160215 A1 | 10/2002 | Peiffer et al. |
| 2003/0071016 A1 * | 4/2003 | Shih et al. .................. 216/54 |
| 2005/0167047 A1 * | 8/2005 | Huff et al. ................ 156/345.1 |

FOREIGN PATENT DOCUMENTS

| | | |
|---|---|---|
| EP | 1 132 418 A1 | 9/2001 |
| EP | 1 160 775 A2 | 12/2001 |
| EP | 1 465 175 A1 | 10/2004 |
| EP | 1 533 657 A1 | 5/2005 |
| GB | 559072 | 2/1944 |
| GB | 637105 | 5/1950 |
| JP | 10-330577 | 12/1998 |
| JP | 2002 086463 | 3/2002 |
| WO | WO-97/06468 | 2/1997 |
| WO | WO-01/42858 A1 | 6/2001 |
| WO | WO 01/70489 A1 | 9/2001 |
| WO | WO 04/000567 | 12/2003 |
| WO | WO-2004/021083 A1 | 3/2004 |
| WO | WO 2004/089546 * | 10/2004 |
| WO | WO 2004/089546 A2 | 10/2004 |
| WO | 2005/119360 | 12/2005 |
| WO | WO 2005/119360 | 12/2005 |
| WO | WO 2006/131153 A1 | 12/2006 |

OTHER PUBLICATIONS

Shimizu; "Method for Producing Lens Sheet"; Patent Abstracts of Japan of JP-2002086463, Mar. 26, 2002.

T. Nielsen et al, "Nanoimprint lithography in the cyclic olefin copolymer, Topas, a highly ultraviolet-transparent and chemically resistant thermoplast," Journal of Vacuum Science & Technology B: Microelectronics Processing and Phenomena, American Vacuum Society, New York, NY, US, vol. 22., No. 4, (Jul. 2004), pp. 1770-1775.

T. Nielsen et al., "Nanoimprint lithography in the cyclic olefin copolymer, Topas®, a highly UV-transparent and chemically resistant thermoplast", Journal of Vacuum Sciences & Technology, vol. 22., No. 4., Jul. 2004.

* cited by examiner

IMPRINT STAMP COMPRISING CYCLIC OLEFIN COPOLYMER

CROSS REFERENCE TO RELATED APPLICATIONS

This application claims the benefit of U.S. Provisional Application No. 60/595,154, filed Jun. 10, 2005, and the right to priority based on European Application No. 05105100.1 filed Jun. 10, 2005 and European Application No. 05110290.3, filed Nov. 3, 2005, the content of each of which is incorporated herein by reference in its entirety.

FIELD OF INVENTION

The present invention relates to the field of imprint lithography, which involves a process for transferring a pattern from a template or stamp to a substrate by contacting a structured surface of the template or stamp with a moldable layer on a target surface of the substrate. More particularly, the invention relates to a polymer stamp for use in an imprint process, having material properties which make the polymer stamp suitable for such a process. The invention also relates to a two step process of making and using such a polymer stamp. In this two-step process a replica of a template pattern is formed in a flexible polymer foil by imprint or injection molding to obtain an intermediate polymer stamp, where after the polymer stamp is used in a secondary step to imprint the pattern in a moldable layer applied to the target surface of the substrate. Specifically, the invention involves a polymer stamp, and a process for manufacturing and using such a polymer stamp, being made of a material comprising one or more Cyclic Olefin Copolymers (COCs).

BACKGROUND

One of the most powerful techniques for reproducing nanostructures—i.e. structures in the order of 100 nm or smaller—is nanoimprint lithography (NIL). In nanoimprint lithography an inverted copy of the surface pattern of a template—often called a stamp—is transferred into an object, comprising a substrate and, applied thereto, a film of a moldable layer often called resist, e.g. a polymer material. After heating the object to a suitable temperature above the glass transition temperature of the polymer film the stamp is pressed towards the film followed by cooling and release—often called demolding—of the stamp, after the desired pattern depth has been transferred into the film. Alternatively, the substrate is covered by a photo-resist material, i.e. a polymer which is sensitive to radiation such that it is cross-linked upon exposure to ultraviolet (UV) radiation, or a pre-polymer which is cured into a polymer upon exposure to radiation. This requires that either the substrate or the stamp is transparent to the applied radiation. In a subsequently performed process after the achieved imprint, the object—comprising the substrate and the patterned polymer film—can be post-processed e.g. by etching of the substrate within the imprinted regions to transfer the pattern to a target surface of the substrate.

The imprint process described above exhibits some difficulties, which have to be considered in order to achieve a perfect pattern transfer from the template into the moldable layer covering the substrate.

If the template and the substrate are not made of the same material, which they generally are not, they will typically have different thermal expansion coefficients. This means that during heating and cooling of the template and the substrate, the extent of expansion and contraction will be different. Even though the dimensional change is small, it may be devastating in an imprint process, since the features of the pattern to be transferred are in the order of micrometers or even nanometers. The result may therefore be reduced replication fidelity.

Very often an inflexible stamp or substrate material is used, and this can lead to the inclusion of air between stamp and moldable layer when the stamp is pressed towards the substrate, also downgrading the replication fidelity. Furthermore, inclusion of particles between stamp and moldable layer during an imprint process can lead to pronounced damages of either the stamp or the substrate especially when neither the stamp nor the substrate are composed by a flexible material. Physical damage to the stamp or the substrate or both can also be caused upon demolding of an inflexible stamp from inflexible substrate, and it is difficult to demold a substrate and a template including patterns with high aspect ratio after an imprint process. A once damaged stamp is usually not recyclable.

SUMMARY OF THE INVENTION

It is an object of the invention to provide a solution for an improved imprint process, having high replication fidelity, and which is easy and suitable to employ industrially.

In order to fulfill this object, a method for transferring a pattern from a template to an object in an imprint process is suggested, which involves a two-step process. In the first step, a template having a structured surface is contacted with a polymer material, in order to produce a flexible polymer replica having a structured surface with an inverse of the pattern of the template surface. The so created flexible polymer replica, herein also referred to as an intermediate polymer stamp, is then released from the template. In the second step, the structured surface of the flexible polymer replica is used as a second template, which is contacted with a moldable surface of an object, to imprint a replica of its pattern in the moldable object surface. This replica exhibits a structured surface having the inverse polarity of the pattern of the intermediate polymer stamp and the same polarity of the pattern of the original template.

The template or master used in an imprint process is generally a high cost product, and wear or damages to the template should therefore be minimized. The template may be made of any material, but is often made of Si, Ni or other metal, or quartz, optionally provided with an anti-stick layer. On the other hand, the object to be imprinted is often made of a relatively hard material, such as silicon or other semiconductor material, coated with a comparatively soft moldable imprint layer. The step of imprinting the object is a crucial moment, where parallel arrangement is important, and a very small residual layer of the moldable layer, often in the order of less than 10 nm, under the imprinted protruding structures is desired. Any non-parallel arrangement or excessive pressure may therefore cause damage to the template. By the suggested two-step imprint method, the template will only be used against a polymer material, which is softer than the template material, thereby minimizing the risk of damage.

Another crucial moment in imprint lithography is the step of demolding or releasing contacting surfaces. When a high cost template is imprinted into a final object, damages to any of the two must be avoided. By using the two-step process, two demolding steps may be included, one where the created polymer stamp is demolded from the template, and optionally another step when the subsequently used polymer stamp is demolded from the imprinted object. As will be described, the second step may be carried out without mechanical separation, by instead dissolving the polymer stamp after the second step, while it is still in contact with the imprinted object.

Faced with the problem of providing an intermediate polymer stamp suitable for a two step imprint process, and a process as such, it has been found that an intermediate polymer stamp made of a material comprising one or more cyclic olefins co-polymers (COCs) is particularly advantageous. A benefit obtained by using such a material is that the polymer stamp shows excellent release properties. More particularly, the surface tension, or surface energy, of the material provides suitable release properties of the polymer stamp in both the first and the second imprint step. Furthermore, the COC polymer stamp is transparent to UV light, making it suitable for a UV-assisted imprint process in the second imprint step.

It should be noted that the polymer backbones of COC polymers are exclusively composed by carbon and hydrogen, and do not contain any polar groups as e.g. carbonyl, carboxyl, ether, esters etc. If there are no additional polar groups or groups exhibiting delocalized electronic states chemically linked to these backbones, COC polymers are characterized by low surface energies, which are comparable to those of polyethylene or polypropylene. Furthermore, the high band gaps of the polymer backbones lead to UV transparency, which makes the material suitable for a UV-assisted imprint process. Of course, particular COC derivatives can be synthesized and are—to some extent—commercially available containing substituents, which are chemically linked to the polymer backbone in order to increase the surface energy and/or to reduce the band gap. These derivatives cannot be regarded as suitable candidates to be deployed for the two-step process as described herein.

In accordance with a preferred embodiment of the invention, the first, or primary, step of manufacturing the polymer stamp is carried out using a template of Si or a metal, such as nickel, titanium, zirconium, niobium, tantalum or aluminium, provided with an anti-adhesion layer preferably having a surface tension of 18 mN/m or less. Such an anti-adhesion layer is obtained by e.g. providing a self-assembled monolayer (SAM) film on the structured template surface. The anti-adhesion layer may e.g. comprise fluorinated all phosphoric acid derivatives, or fluorinated alkyl poly-phosphoric acid derivatives, PTFE or fluorinated alkyl silanes. Combined with a COC polymer material for the polymer stamp to be created, having a surface tension in the rage of 28-40 mN/m, satisfactory anti-adhesion properties are obtained.

In the secondary imprint step, when the created and demolded polymer stamp is used for pattern transfer to a substrate, the material properties again need to be matched, especially if the polymer stamp is to be mechanically demolded. Also for this reason, a COC-containing polymer stamp has turned out to show excellent results. By using a COC derivative having a surface tension of 28-40 mN/m, preferably in the range of 28-37 mN/m, and even more preferred in the range of 30-35 mN/m, it is possible to perform imprint in e.g. PMMA having a surface tension of approx. 41 mN/m, or even more preferred in a UV cross-linkable or UV curable material, having an even higher surface tension.

BRIEF DESCRIPTION OF THE DRAWINGS

Embodiments of the invention will be described in more detail below, with reference to the accompanying drawings, on which.

DETAILED DESCRIPTION OF PREFERRED EMBODIMENTS

Figure 1:
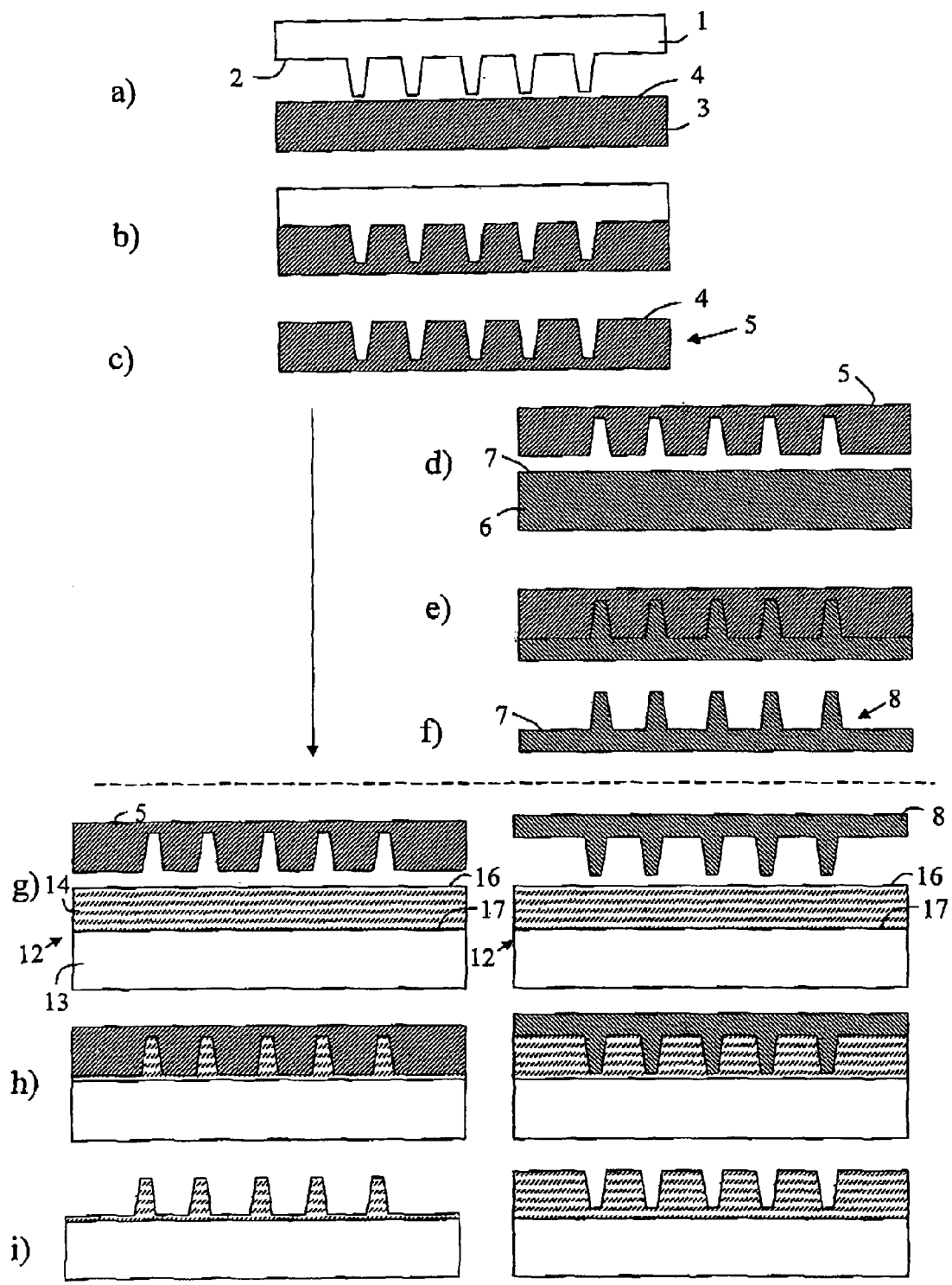
FIG. 1 schematically illustrates the two-step process to manufacture replicas from a template into an object surface according to an embodiment of the invention.

The present invention relates to what is herein referred to as a "two-step imprint process". This term is to be understood as a process in which in a first step one or more replicas of a template having a nanometer and/or micrometer size patterned surface is formed into one or more flexible polymer foils by an imprint process or an injection molding process. The patterned polymer foil may be used as a polymer stamp in a second step, Alternatively, the patterned polymer foil is used as a stamp to make another imprint on another polymer foil, which is subsequently used in the second step. This way, the first step of the process may generate both flexible negative polymer replicas, where the pattern is inverted to that of the original template, and flexible positive polymer replicas, where the pattern is similar to that of the original template. In the second step a so-produced replica can be used as a flexible polymer stamp to reproduce the pattern into an object surface through a subsequent performed imprint process employing thermal imprint, UV-imprint, or both.

The term "nano-imprinting process" or "imprint process" as used herein refers to a process for the creation of an inverted copy of a nano- and/or micro-structured surface pattern of a template or stamp, which is generated by pressing the stamp into a moldable layer, such as a polymer or pre-polymer, in order to deform the layer. The layer may be a separately coated film on top of a base or substrate, where the base and the layer may be of different materials. Alternatively, the layer may simply be a portion of a single material object, where the layer is defined as a portion stretching from a surface of the object down to a certain depth into the bulk of the object. The moldable layer may either be heated-up above its glass transition temperature $T_g$ followed by cooling-down to below said glass transition temperature during the imprinting (hot embossing) process, and/or the polymer may be cured or cross-linked with the help of UV-light exposure during or after the imprinting process. The patterned surface of the template, and of the imprinted layers, may have structures on a micrometer or nanometer scale both in terms of depth and width.

The term "replication fidelity" refers to the creation of an inverted copy of the stamp structure in which the inverted topography of the stamp surface is completely reproduced.

During the course of research in the field of imprint technology, the inventors have found that some properties are important for a material to be used in an intermediate stamp, and a good two step imprint process. Some of these material properties are:

Capability to roll thin, flexible foils from this material having thicknesses between 100 and 1000 micrometers.

Capability to produce replicas of a stamp or a template having a nano and/or micro-patterned surface by deforming a foil composed of a polymer material with the help of an imprint process, or by injection molding from granulates or grains composed by this material.

The material should have low surface energies of less than 40 mN/in (or dynes/cm), and preferably less than 37 mN/m or even less than 35 mN/m, but of course the surface energy should be higher than that of the template surface equipped with an anti-stick layer, see discussion below.

The material should not mix with the organic material (e.g. polymer, oligomer and/or monomer material) to be imprinted during the secondary imprint process.

The material should have well-defined glass temperatures between 100 and 250° C.

The material should have pronounced light transmittance: 80% transmittance for wavelength larger than 300 nm (test method ASTM: D1003).

Other preferred properties the material should have:

A coefficient of linear thermal expansion (CTE) between $60-80 \times 10^{-6}$ m/(mK) (test method: ASTM D696), A low molding shrinkage of less than 2% (test method: ASTM D955), A Pencil hardness between 3H and HB (test method: JIS K5401), A Refractive index: 1.4-1.6, and A slightly limited or good chemical resistance against isopropanol, acetone and sulphuric acid.

A material group, which has been found to match the requirements set out, are Cyclo-Olefin Copolymers (COCs), a class of polymers based on cyclic olefin monomers and ethane. The materials are characterized by high glass-transition temperature, optical clarity, low shrinkage, low moisture adsorption and low birefringence, mostly because of the fact that the bulky cyclic olefin units are randomly or alternatively attached to the polymer backbone. For that reason the copolymer becomes amorphous giving the material the desired properties which make them suitable for the two-step imprint process. There are several types of commercial COC materials based on different types of cyclic monomers and polymerization methods, For example, cyclic olefin copolymers are produced by Ticona GmbH in Germany or Mitsui Chemicals America, Inc. in USA with the help of chain copolymerization of cyclic monomers such as 8,9,10-trinorborn-2-ene (norbornene) or 1,2,3,4,4a,5,8,8a-octahydro-1,4:5,8-dimethanonaphthalene (tetracyclododecene) with ethane, leading to products having the trade names Topas and Apel, respectively. Alternatively, COCs are available from Japan Synthetic Rubber Co., Ltd. in Japan and Zeon Chemicals LP in USA, with the help of ring-opening metathesis polymerization of various cyclic monomers followed by hydrogenation, leading to products having the trade names Arton and Zeonex/Zeonor, respectively.

An important feature to consider is the surface energy, or surface tension, of the material to use. A molecule located within a liquid is exposed to attractive forces (cohesion) from all directions from its surrounding molecules. These forces are compensating each other when the separation distance between molecule and surface is sufficiently large. However, when the separation between molecule and surface is smaller than the range of its molecular forces a resulting traction appears perpendicular to the surface towards the centre of the liquid. This fact implies that work is necessary to move a molecule from the centre of the liquid to its surface or in other words molecules located near the surface have higher potential energy compared to those located in the centre. In order to increase a surface molecules have to be moved to the surface whereas the extent of the required work needed to create a surface per area is defined as the surface energy, specific surface energy, or surface energy per area measured in units of $mJ/m^2$, or $ergs/cm^2$. On the other hand, mechanically force is necessary to increase a surface because the liquid tries to minimise its surface area itself as much as possible. The force acting on the edges of the surface per length of these edges is defined as the surface tension and measured in newton $meter^{-1}$ (N/m), mN/m, or dynes $cm^{-1}$. In the case of liquids the terms "specific surface energy" and "surface tension" are synonyms, normally abbreviated by "$\sigma$" or "$\gamma$". When given herein, surface tension levels represent values at 25° C., but the values usually decrease with increasing temperature.

Also for a solid work is necessary to create or to increase a surface. Since the bulk of a solid does not cleave spontaneously, the internal energy of the system must increase when a surface is created by e.g. a cleavage process. In the same manner as observed for a liquid also for a solid the specific surface energy is defined as the constant of proportionality between the increase of internal energy of a system and its created surface area. It should also be noted that the specific surface energy as such is not only dependent on the choice of material, but also on e.g. the topography of the surface. The lowest surface energies demonstrate atomically flat surfaces of defect-free single crystals. However, here the crystallographic structure of the surface is modified compared to that of the bulk, leading—in the most cases—to a more roughen super lattice, which is established in order to minimise the surface energy.

The surfaces of the master template and that of the polymer material from which the flexible polymer replica is produced must exhibit sufficient anti-adhesion and anti-sticking properties against each other in order to release the polymer stamp from the template after performed imprint without damaging the imprinted pattern. Furthermore, in the secondary step the material of the flexible polymer replica must exhibit sufficient anti-adhesion properties against the surface of the resist material layer on the substrate.

Due to energy minimization liquids having lower Lace energy values will generally spread on solids of higher values. The reverse is true for the opposite case. Therefore, good anti-adhesion and anti-sticking properties between the different materials of the invention are conferred with the following relations between the surface energies of the different materials:

$$\sigma_{solid}(\text{template material}) < \sigma_{liquid}(\text{polymer material}),$$
and $$\sigma_{solid}(\text{polymer material}) < \sigma_{liquid}(\text{resist material}). \quad (1)$$

Here, template material refers to the material of the surface contacted with the polymer material, which therefore refers to an anti-sticking layer of the template if is such a layer is provided. It should also be noted that the term "surface energy/tension" is just correct for materials in vacuum. For practical reasons the term is often used in cases of solid-air and liquid-air interfaces. For an absolute accurate evaluation of the wetting properties of a solid-liquid interface the "interfacial energy" has to be considered additionally, whereas Young's equation expresses the equilibrium situation:

$$(\sigma_{solid-vacuum} - \sigma_{solid-liquid} = \sigma_{liquid-vacuum} \cos(\phi)) \quad (2)$$

Here, the contact angle $\phi$ between the solid surface and the liquid surface must be lying between 90° and 180° for perfect non-wetting or anti-sticking behavior, which leads to the relation $\sigma_{solid-vacuum} < \sigma_{solid-liquid}$. Additionally, in some cases also the dispersive part $\sigma_i^d$ of the surface energy (describing the non-polar, long-range London forces) as well as its polar part $\sigma_i^p$ (describing polar, short-range non-London forces) have to be considered in order to investigate the joint strength of the interface carefully. Nevertheless, the interfacial energy ($\sigma_{solid-liquid}$) as well as $\sigma_i^d$ and $\sigma_i^p$ are normally unknown and the relations of equations (1) can be considered as an adequate and a more helpful approximation, whereas $\sigma_{solid}$ (template material) means the surface energy of the original template or stamp coated by an anti-sticking film, $\sigma_{liquid}$ (polymer material) means the surface energy of the flexible polymer foil heated to a temperature above its glass temperature, $\sigma_{solid}$ (polymer material) means the surface energy of the flexible polymer foil in solid phase after the performed imprint, and $\sigma_{liquid}$ (resist material) means the surface energy of the resist material deposited on a substrate surface.

It has been found that COC polymer materials according to the invention, with a surface tension in the range of 28-40 mN/m, lead to pronounced anti-adhesion properties against other materials, making it ideal to apply them in the imprint process of the present invention. It should be noted, though, that not all COCs have a surface tension within this range. Tests have been made on a number of commercially available COCs by J.Y. Shin et al., as published in the IUPAC Technical Report "Chemical Structure and Physical Properties of Cyclic Olefin Copolymers", Pure Appl. Chem., Vol. 77, No. 5, pp. 801-814, 2005, DOI: 10.1351/pac200577050801. Out of six tested COC polymers, five are within the range of 28-40 mN/m two are within the range of 28-37 mN/m, and only one is in the range of 30-35 mN/m. Solely considering the issue of anti-adhesion, a COC in the larger range fulfils the conditions of $\sigma_{solid}$ (polymer material) in equations (1) and is therefore advantageous for a two step imprint process as described herein, when the master template has a surface tension of less than 20 mN/m, typically in the region of 18 mN/m or less, and the resist layer applied to the substrate is in the region of 45 mN/m. For a preferred embodiment, where the template has a SAM anti-stick coating giving the template a surface tension of about 18 mN/m, and a UV cross-linkable resist material, such as SU8, having a surface tension of approximately 45 mN/m is used on the substrate, a most desired surface tension for the intermediate polymer stamp would be about 31.5 mN/m, or a range of 30-33 mN/m.

Herein, the term "flexible polymer foil" refers to a flexible, ductile, and transparent polymer foil. In accordance with the invention, the flexible polymer foil, or polymer stamp when patterned, Comprises a Cyclo-Olefin Copolymer (COC). Preferably, the polymer foil is homogenously made of one or more COCs, but in an alternative embodiment the material of the polymer foil may comprise other compounds as well. In preferred embodiments, the polymer foil is made up of one or more a carefully selected COC derivatives, such that the polymer foil has a surface tension in the range of 28-40 mN/m. A preferred narrower range is 28-31 mN/m, 30-35 mN/m, and even 30-33 mN/m.

Furthermore, a polymer foil formed of a COC material is transparent to a wavelength range usable for cross-linking or in other ways solidifying a radiation-sensitive moldable layer, whereby radiation-assisted imprint may selectively be used when using the polymer stamp in the second imprint step for imprint on a substrate, while both the master template and the substrate may be provided in materials which are not transparent to radiation of a usable wavelength range.

The template is a comparatively expensive element to produce and it is generally not possible to repair or recycle a once damaged template. The polymer stamp, however, is easily manufactured from a comparatively inexpensive material in accordance with the method according to the invention, and is preferably disposed after being used a couple of times, or even only once. The polymer stamp may be demolded, or released, from the substrate and then thrown away, or it may be dissolved when still attached to the target surface of the substrate in a bath with a suitable liquid solution selected to dissolve the polymer stamp but not the substrate or the solidified moldable layer on the target surface of the substrate.

Since the created polymer stamp is used as a secondary template for imprint on the target surface of the substrate, and the substrate generally is not a polymer material, the thermal expansion coefficients of the polymer stamp and the substrate will typically differ. In order to overcome the aforementioned drawbacks resulting from such a scenario, at least the secondary imprint step where the polymer stamp is pressed into the moldable layer on the substrate is performed according to a combined radiation- and heat-assisted imprint process in an embodiment of the invention. According to this process, a radiation-sensitive material is used as the moldable layer on the substrate, and the steps of pressing the polymer stamp and the substrate together, flooding the moldable layer with radiation, and postbaking the layer, and preferably also the steps of releasing the pressure and demolding the polymer stamp from the substrate, are advantageously performed at an elevated constant temperature maintained by means of a temperature control device. The temperature control device typically includes a heater device and a control circuit for balancing supply of heat to obtain and maintain a determined temperature, and possibly also a cooling device.

An embodiment of the first, or primary, step of the two step process will now be described with reference to FIGS. 1a to 1f of the drawings. The process of the primary step according to two different embodiments are schematically illustrated in FIG. 1. The process of FIGS. 1a to 1f illustrate creation of an intermediate polymer stamp using thermal imprint. However, there are other possible techniques for creating the polymer stamp as will be outlined below.

FIG. 1a displays a template 1, composed of e.g. silicon, nickel or other metal such as aluminum, quartz, or even a polymer material. Template 1 has a patterned surface 2, comprising ribs, grooves, protrusions or recesses, having heights and widths in the order of micrometers or nanometers. Preferably, the template surface 2 is provided with an anti-adhesion layer, as will be described, The template 1 is placed with surface 2 facing and contacting a surface 4 of a flexible polymer foil 3 comprising or being homogenously made of a COC material.

With the help of a suitable imprint process as illustrated in FIG. 1b) an inversion of the pattern of template surface 2 is formed into a surface layer at surface 4 of the flexible polymer foil 3. After the template surface 2 has been placed in contact with surface 4 of polymer foil 3, the polymer foil is heated to a temperature above the glass temperature $T_g$ of the used COC polymer in the foil. When the surface layer has reached its glass transition temperature, pressure is applied to press template 1 and polymer foil 3 together such that the pattern of surface 2 is imprinted in the surface layer at surface 4 of polymer foil 3. Pressing may be achieved by means of a soft press-technique using a fluid or gas pressure supplied by means of a membrane, as will be explained in more detail with reference to the secondary step of the process according to the invention, Alternatively, a more conventional hard press technique may be used. Since the polymer stamp created in the primary step is not the final product, parallelism is not a crucial element of the primary step in the same manner as for the secondary step.

In a thermal NIL-process according to FIG. 1a)-c), template 2 is covered with a suitable sheet of a COC material, such as Topas from Ticona, USA, or Zeonor from Zeon Corp., Japan. An imprint membrane is preferably placed on top of the polymer sheet, after which the sandwiched arrangement is sucked by vacuum and heated. When the imprint temperature is reached a medium, e.g. a liquid but preferably a gas, present behind the membrane, is pressurized to between 20-80 bars. After pattern transfer, the so created polymer stamp is demolded from the master. A good thermoplastic sheet needs to have a narrow process window regarding imprint temperature and release temperature as well as high mechanical strength of the generated nanometer structures that have to serve as mold in the subsequent process. A high degree of transparency for UV-radiation is highly beneficial. These properties are obtained by using a polymer foil of a COC material.

Dependent on the specific process used, i.e. thermal, UV or combined thermal and UV at constant temperature, template 1 and the imprinted polymer foil can be separated either after cooling or without cooling of the polymer foil after the performed imprint process depending on the chosen material and its properties. After release of the template 1 from the polymer surface 4, the imprinted polymer foil 5, also called the replica, displayed in FIG. 1c) having a pattern in its surface 4 which is inverted or negative to that of the original template 1, can be used as a flexible polymer stamp 5.

Figure 11:
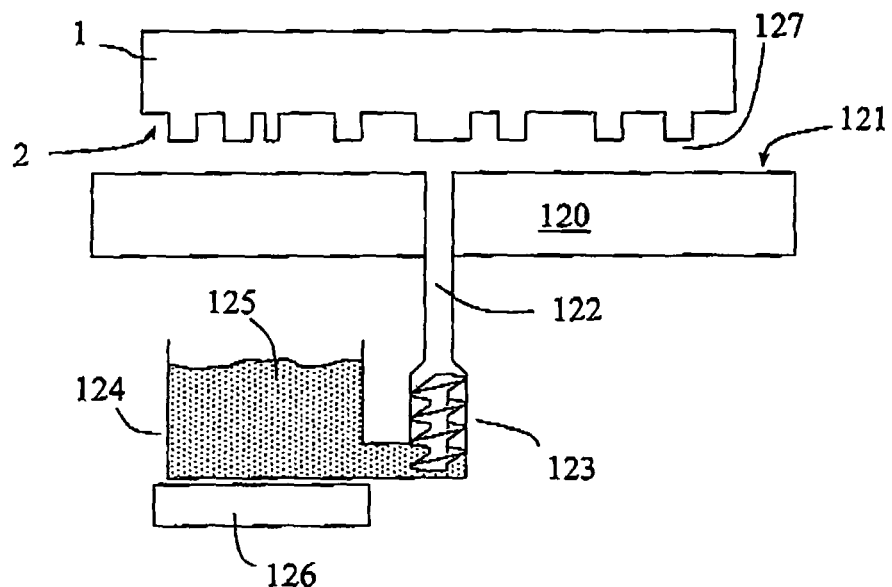
FIGS. 11-13 schematically illustrate an injection molding process for use in the primary step of the two step process according to an embodiment of the invention.
Figure 12:
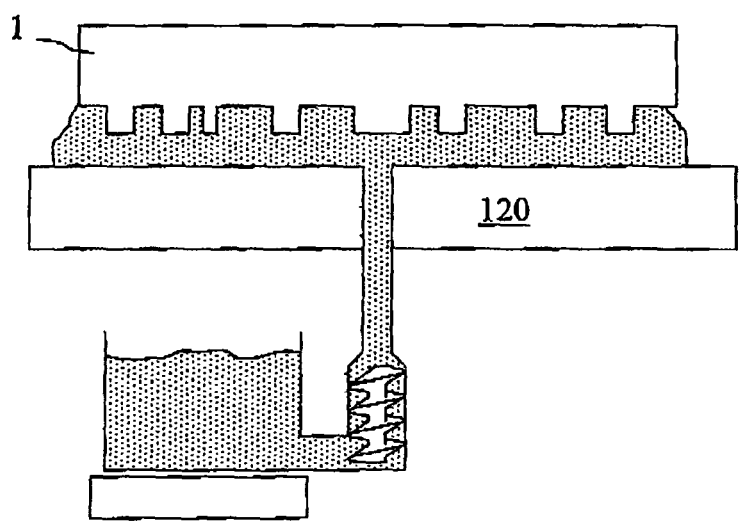
Figure 13:
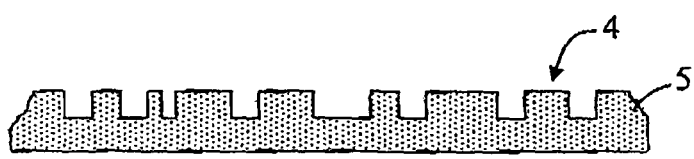

FIGS. 11-13 schematically illustrate an alternative method for creating the polymer stamp, by means of injection molding, In FIG. 11 a first support element 120 is placed with a support surface 121 parallel to structured surface 2 of template 1, with a small intermediate spacing 127 defining the final average thickness of the polymer stamp. Polymer material 125 is preferably provided in the form of grains or pellets, in the majority of cases to be molten in a melting chamber 124 by using a heater 126, which is included for the purpose of heating the solid polymer material into molten form. A conduit 122 leads from melting chamber 124 to spacing 127 between support surface 121 and template surface 2, e.g. through an orifice in support surface 121 as illustrated. Alternatively, the conduit may lead to spacing 127 from a side portion between support element 120 and template 1. An injector device 123 is further provided, operable to press molten polymer material through conduit 122 into spacing 127. Instead of melting the polymer in the melting chamber 124, the polymer material can also be melted on its way trough the injector device 123 and conduit 122.

When support member 120 and template 1, preferably carried on a second support member (not shown), are placed in close parallel arrangement as shown in FIG. 11, injector device 123 is operated to inject the molten polymer. In the example of the drawings, injector device 123 comprises a screw, driven to rotation by a motor (not shown), so as to drive molten polymer up through conduit 122. As shown in FIG. 12, the molten polymer is pressed into spacing 127 to fill out the spacing, including the recesses formed in the patterned template surface 2. Template surface 2 is controlled by cooling means (not shown), such as ducts for a cooling fluid arranged in the second support element holding the template 1, to have a temperature, which is lower than the melting temperature of the polymer material 125. This way, when the molten polymer material is rapidly pressed out to fill spacing 127, the polymer material solidifies by cooling.

The template 1 is then released from the solidified polymer material, which thereby forms a polymer stamp 5 having a stamp surface 4 which is an inverse replica of template surface 2, as shown in FIG. 13. Release, or demolding, may be performed by means of any known technique.

In accordance with the invention, polymer stamp 5 is either used in the secondary step to transfer the pattern of surface 4 to a target substrate, or it is used in an additional primary step to produce a second inversed replica 8 into another flexible polymer foil 6 according to FIGS. 1d) to 1f), in a similar process as described above. A purpose behind employing a further primary step is to ensure that the final pattern to be created in the target substrate is to be an inverse of the template surface pattern. In such an embodiment, a polymer foil 6 is used which is be composed by a polymer, whose glass transition temperature and imprint temperature is lower than that of the flexible polymer stamp 5. Furthermore, the engaging surfaces 4 and 7 of polymer foil 6 and flexible polymer stamp 5 exhibit anti-adhesion properties against to each other. In a preferred embodiment, anti-adhesion properties are present from the beginning due to the chemical nature of the used polymer foils. Furthermore, the anti-adhesion properties may be further enhanced by deposition of anti-adhesion layers comprising suitable release agents on one or both polymer surfaces. Additionally, if the polymer foil 6 should be cross-linked after exposure to radiation at least one of the polymer foils 5 and 6 must be transparent to the applied radiation or alternatively transmit enough radiation to enable a cross-linking of the surface layer of foil 6, or the entire foil 6 if it is massive.

Creation of a new polymer stamp 8, which is inverted from the first polymer stamp 5 and thus substantially identical to template 1, with regard to the pattern, includes placing polymer stamp 5 with its patterned surface 4 facing and in contact with a surface 7 of the second polymer foil 6. As before, second polymer foil 6 may be massive or have a carrier sheet to which a surface layer is applied at surface 7. In order to be able to imprint the pattern of surface 4 in the surface layer of foil 6, foil 6 is heated above the glass transition temperature of its surface layer if a thermal imprint process is used. As shown in FIG. 1e), pressure is then applied to press the first polymer stamp 5 into the surface-layer of polymer foil 6. After performed imprint the flexible polymer stamp 5 can be removed from the polymer foil 6 mechanically, i.e. mostly after cooling the polymer foil 9, or alternatively the whole stamp 5 or portions of it can be dissolved chemically with the help of one or more suitable solvents in a suitable process. The result is a new polymer stamp 8 with a surface 7 having a pattern corresponding to that of the original template 1.

The so-produced replicas 5 or 8 having inverted or identical surface patterns to that of the original template 1, respectively, will be used as flexible polymer templates in a secondary imprint step according to the invention as schematically illustrated in FIGS. 1g) to 1i) on the left hand side and the right hand side, respectively. Here, surfaces 4 or 7 of one of the flexible polymer stamps 5 or 8 will be placed in contact with a surface 16 of an object 12 comprising a substrate 13 having a target surface 17 covered by a thin moldable surface layer 14 of a radiation-sensitive material, e.g. a pre-polymer or a polymer which is cross-linkable with the help of the exposure to radiation. Surface 4 or 7 of the flexible polymer stamp 5 or 8 exhibit anti-adhesion properties against surface 16 of the moldable layer 14, due to the material compositions of the surfaces. With the help of an applied pressure forcing one of the flexible polymer templates 5 or 8 and object 12 together and applied exposure of selected portions of the polymer film 14 to radiation, an inversion of the pattern of the polymer stamp surfaces is formed in the moldable layer 14, as shown in FIG. 1*h*. The flexible polymer stamp 5 or 8 is transparent to the applied radiation or shows minor absorbance in order to transmit a sufficient amount of radiation necessary for curing or cross-linking the material of surface layer 14 upon exposure to radiation. After performed imprint and postbaking as shown in FIG. 1*h*), the flexible polymer stamp 5 or 8 can be removed from the substrate 13 mechanically or, alternatively the whole polymer stamp 5 or 8 or portions of it can be dissolved chemically with the help of one or more suitable solvents in a suitable process.

FIG. 1*i*) shows the resulting imprinted object 12 after release of the flexible polymer stamp 5 or 8. In order to permanently affix the transferred pattern to the substrate, further processing steps are typically employed to remove the thinnest portions of the remaining film 14 to expose the target surface 17 of the substrate, and then to either etch the target surface or plate it with another material. The actual details of this further processing are not important for understanding of the invention, though.

FIG. 1 is a relatively simple representation of the process according to the invention. The primary step, depicted above the dashed line, may be performed using thermal imprint directly in the massive COC polymer foil, or by injection molding. If thermal imprint is used in steps 1*a*) to 1*c*), there will typically be a difference in the thermal expansion between template 1, which e.g. may be nickel, and the polymer foil 3. However, the resiliency and flexibility of polymer foil 3, which furthermore has a thickness which is substantially larger than the height of the pattern structures, guarantees that the polymer foil is stretched and contracted by the thermal expansion imposed on template 1, without damaging the pattern features on the foil surface 4. The thickness of the polymer foil is typically in the range of 50-500 µm, whereas the height or depth of the pattern structures is in the range of 5 nm to 20 µm, as will be shown by means of examples below. Other sizes are possible though.

However, the second step depicted below the dashed line in FIG. 1 is preferably performed using combined heat and radiation. The reason for this is that when imprint is to be performed on the substrate, the remaining or residual surface layer on the target surface of the substrate is generally extremely thin, in the order of a few nanometers. Heating and cooling a sandwiched pair of stamp and polymer having different thermal expansion, will therefore often be devastating to fine structures, which tend to be completely ripped off. However, thanks to the process according to an embodiment of the invention, where the steps of pressing, radiating and postbaking are all performed at a controlled constant temperature, thermal expansion effects are eliminated.

Figure 5:
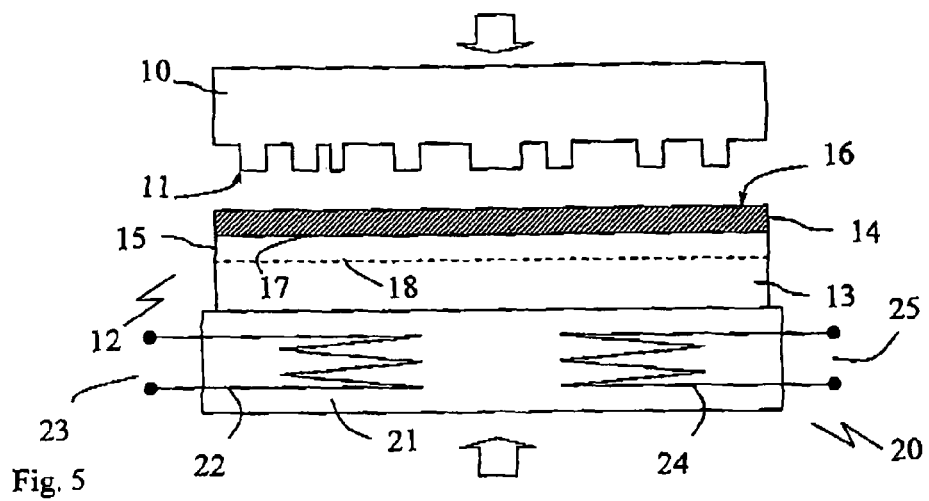
FIGS. 5-7 illustrates process steps of an embodiment of the invention.
Figure 6:
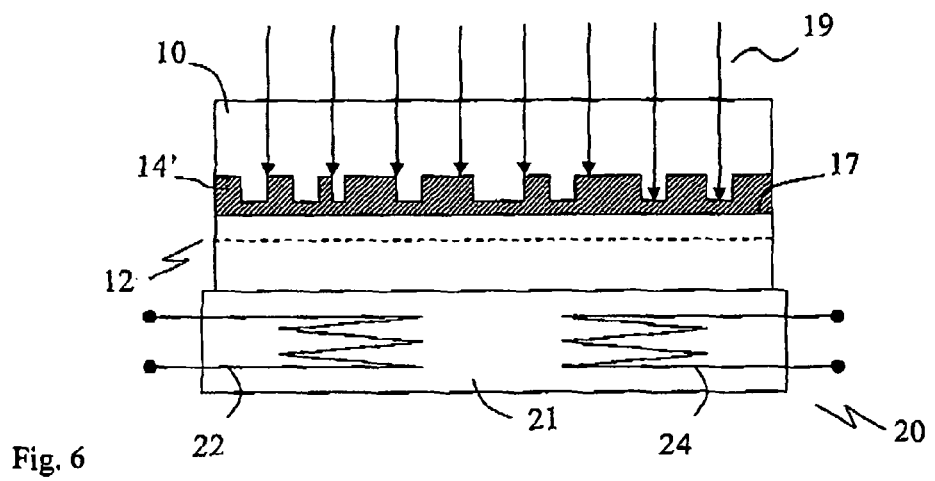
Figure 7:
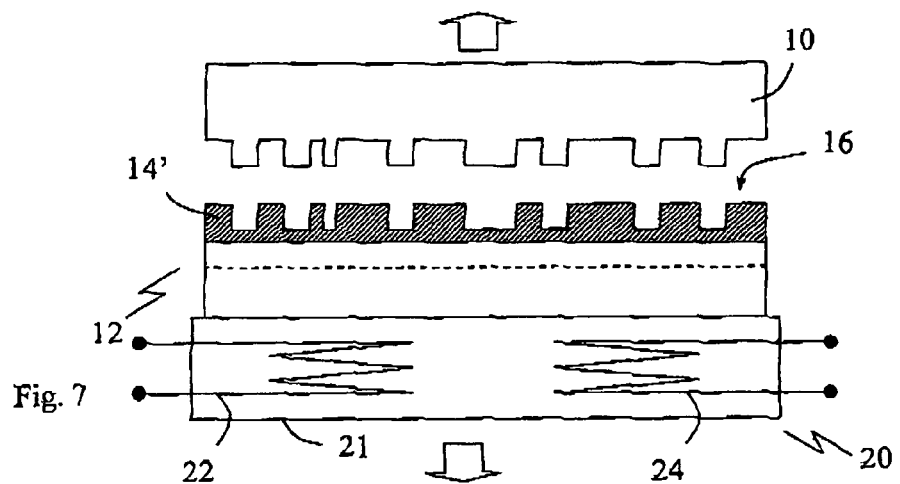

FIGS. 5-7 schematically present the basic process steps of the actual pattern transfer steps, or imprint steps, in the secondary step of an embodiment of the invention. These drawings correspond to FIGS. 1*g*) to 1*h*), either the left hand side example or the right hand side example, but in greater detail. The secondary imprint step may a purely thermal imprint process, i.e. pressing of the polymer stamp into a polymer layer heated above its glass transition temperature, followed by cooling and demolding. For such an embodiment, the polymer has to be carefully selected with respect to the material of the COC polymer stamp, in that the glass transition temperature $T_g$ for the substrate layer 14 must be lower than the glass transition temperature for the COC. As an example, the polymer stamp may be made in a Zeonor ZF14 foil with $T_g=136°$, or a Zeonex E48R foil with $T_g=139°$, whereas the moldable substrate layer 14 may be PMMA, with $T_g=93°$. A preferred embodiment, though, makes use of a material, which is curable or cross-linkable by means of UV radiation, as substrate layer 14.

In FIG. 5 a polymer stamp 10 is illustrated, which consequently may correspond to either polymer stamp 5 or 8 in FIG. 1. Polymer stamp 10 has a structured surface 11, corresponding to surface 4 or 7, with a predetermined pattern to be transferred, in which three-dimensional protrusions and recesses are formed with a feature size in height and width within a range of 1 nm to several µm, and potentially both smaller and larger. The thickness of polymer stamp 10 is typically between 10 and 1000 µm. A substrate 12 has a target surface 17, which is arranged substantially parallel to polymer stamp surface 11, with an intermediate spacing between the surfaces at the initial stage shown in FIG. 5. The substrate 12 comprises a substrate base 13, to which the pattern of polymer stamp surface 11 is to be transferred. Though not shown, the substrate may also include a support layer below the substrate base 13. In a process where the pattern of polymer stamp 10 is to be transferred to substrate 12 directly through an imprint in a polymer material, said material may be applied as a surface layer 14 directly onto the substrate target surface 17. In alternative embodiments, indicated by the dashed line, a transfer layer is also employed, of e.g. a second polymer material. Examples of such transfer layers, and how they are used in the subsequent process of transferring the imprinted pattern to the substrate base 13, are described in U.S. Pat. No. 6,334,960. In an embodiment including a transfer layer 15, target surface 17 denotes the upper or outer surface of the transfer layer 15, which in turn is arranged on the substrate base surface 18.

Substrate 12 is positioned on a heater device 20. Heater device 20 preferably comprises a heater body 21 of metal, e.g. aluminum. A heater element 22 is connected to or included in heater body 21, for transferring thermal energy to heater body 21. In one embodiment, heater element 22 is an electrical immersion heater inserted in a socket in heater body 21. In another embodiment, an electrical heating coil is provided inside heater body 21, or attached to a lower surface of heater body 21. In yet another embodiment, heating element 22 is a formed channel in heater body 21, for passing a heating fluid through said channel. Heater element 22 is further provided with connectors 23 for connection to an external energy source (not shown). In the case of electrical heating, connectors 23 are preferably galvanic contacts for connection to a current source. For an embodiment with formed channels for passing a heating fluid, said connectors 23 are preferably conduits for attachment to a heated fluid source. The heating fluid may e.g. be water, or an oil. Yet another option is to employ an IR radiation heater as a heater element 22, devised to emit infrared radiation onto heater body 21. Furthermore, a temperature controller is included in heater device 20 (not shown), comprising means for heating heater element 22 to a selected temperature and maintaining that temperature within a certain temperature tolerance. Different types of temperature controllers a well known within the art, and are therefore not discussed in further detail.

Heater body 21 is preferably a piece of cast metal, such as aluminum, stainless steel, or other metal. Furthermore, a body 21 of a certain mass and thickness is preferably used such that an even distribution of heat at an upper side of heater device 20 is achieved, which upper side is connected to substrate 12 for transferring heat from body 21 through substrate 12 to heat layer 14. For an imprint process used to imprint 2.5" substrates, a heater body 21 of at least 2.5" diameter, and preferably 3" or more, is used, with a thickness of at least 1 cm, preferably at least 2 or 3 cm. For an imprint process used to imprint 6" substrates, a heater body 21 of at least 6" diameter, and preferably 7" or more, is used, with a thickness of at least 2 cm, preferably at least 3 or 4 cm. Heater device 20 is preferably capable of heating heater body 21 to a temperature of up to 200-300° C., though lower temperatures will be sufficient for most processes.

For the purpose of providing controlled cooling of layer 14, heater device 20 may further be provided with a cooling element 24 connected to or included in heater body 21, for transferring thermal energy from heater body 21. In a preferred embodiment, cooling element 24 comprises a formed channel or channels in heater body 21, for passing a cooling fluid through said channel or channels. Cooling element 24 is further provided with connectors 25 for connection to an external cooling source (not shown). Preferably, said connectors 25 are conduits for attachment to a cooling fluid source. Said cooling fluid is preferably water, but may alternatively be an oil, e.g. an insulating oil.

A preferred embodiment of the invention makes use of a radiation cross-linkable thermoplastic polymer solution material for layer 14, which preferably is spin-coatable. These polymer solutions may also be photo chemically amplified. An example of such a material is mr-L6000.1 XP from Micro Resist Technology, which is UV cross-linkable. Other examples of such radiation cross-linkable materials are negative photoresist materials like Shipley ma-N 1400, SC100, and MicroChem SU8. A material which is spin-coatable is advantageous, since it allows complete and accurate coating of an entire substrate.

Another embodiment makes use of a liquid or near liquid pre-polymer material for layer 14, which is polymerizable by means of radiation, Examples of available and usable polymerizable materials for layer 14 comprise NIP-K17, NIP-K22, and NIP-K28 from ZEN Photonics, 104-11 Moonj i-Dong, Yusong-Gu, Daejeon 305-308, South Korea. NIP-K17 has a main component of acrylate, and has a viscosity at 25° C. of about 9.63 cps. NIP-K22 also has a main component of acrylate, and a viscosity at 25° C. of about 5.85 cps. These substances are devised to cure under exposure to ultraviolet radiation above 12 mW/cm$^2$ for 2 minutes. Another example of an available and usable polymerizable material for layer 14 is Ormocore from Micro Resist Technology GmbH, Koepenicker Strasse 325, Haus 211, D-12555 Berlin, Germany. This substance has a composition of inorganic-organic hybrid polymer, unsaturated, with a 1-3% photopolymerization initiator. The viscosity of 3-8 mPas at 25° C. is fairly high, and the fluid may be cured under exposure of radiation with 500 mJ/cm$^2$ at a wavelength of 365 nm. Other usable materials are mentioned in U.S. Pat. No. 6,334,960.

Common for all these materials, and any other material usable for carrying out the invention, is that they are moldable and have the capability to solidify when exposed to radiation, particularly UV radiation, e.g. by cross-linking of polymer solution materials or curing of pre-polymers. They also generally have a surface tension of more than 40 mN/m, typically about 45 mN/m or more.

The thickness of layer 14 when deposited on the substrate surface is typically 10 nm-10 μm, depending on application area. The curable or cross-linkable material is preferably applied in liquid form onto substrate 12, preferably by spin coating, or optionally by roller coating, dip coating or similar.

One advantage with the present invention compared to prior art step and flash methods, typically when using a cross-linkable polymer material, is that the polymer material may be spin coated on the entire substrate, which is an advantageous and fast process offering excellent layer evenness. Cross-linkable materials, such as those mentioned, are typically solid at normal room temperature, and a substrate which has been pre-coated at an elevated temperature may therefore conveniently be used. The step and flash method, on the other hand, has to use repeated dispensation on repeated surface portions, since that method is incapable of handling large surfaces in single steps. This makes both the step and flash process and the machine for carrying out such a process complex, time consuming in terms of cycle time, and hard to control.

According to a preferred embodiment of the invention, the process steps of imprinting, solidifying the imprint layer material by radiation, and postbaking the material, are performed at a constant temperature.

The arrows of FIG. 5 illustrate that the polymer stamp surface 11 is pressed into surface 16 of the moldable material layer 14. At this step, heater device 20 is preferably used to control the temperature of layer 14, for obtaining a suitable fluidity in the material of layer 14. For a cross-linkable material of layer 14, heater device 20 is therefore controlled to heat layer 14 to a temperature $T_p$ exceeding the glass temperature $T_g$ of the material of layer 14. In this context, $T_p$ stands for process temperature or imprint temperature, indicating that it is one temperature level common for the process steps of imprint, exposure, and postbaking. The level of constant temperature $T_p$ is of course dependent on the type of material chosen for layer 14, since it must exceed the glass transition temperature $T_g$ for the case of a cross-linkable material and also be suitable for postbaking the radiation-cured material of the layer. For radiation cross-linkable materials $T_p$ typically ranges within 20-250° C., or even more often within 50-250° C. For the example of mr-L6000.1 XP, successful tests have been performed with a constant temperature throughout imprint, exposure and postbake of 100-120° C. For embodiments using radiation-curable pre-polymers, such materials are typically liquid or near liquid in room temperature, and therefore need little or no beating to become soft enough for imprinting, However, also these materials must generally go through post-baking for complete hardening after exposure, prior to separation from the polymer stamp, The process temperature $T_p$ is therefore set to a suitable post-baking temperature level already in the imprint step beginning at the step of FIG. 5.

FIG. 6 illustrates how the structures of polymer stamp surface 11 has made an imprint in the material layer 14, which is in fluid or at least soft form, at which the fluid has been forced to fill the recesses in polymer stamp surface 11. In the illustrated embodiment, the highest protrusions in polymer stamp surface 11 do not penetrate all the way down to substrate surface 17. This may be beneficial for protecting the substrate surface 17, and particularly the polymer stamp surface 11, from damage. However, in alternative embodiments, such as one including a transfer layer, imprint may be performed all the way down to transfer layer surface 17. In the embodiment illustrated in FIGS. 5-7, the polymer stamp is made from a COC material which is transparent to radiation 19 of a predetermined wavelength or wavelength range, which is usable for solidifying a selected moldable material. For polymer stamps created using radiation as described above, the remaining layer of the radiation-sensitive surface layer in which the pattern is formed is preferably also transparent to UV radiation, or alternatively so thin that its UV absorption is low enough to let through a sufficient amount of radiation. Radiation 19 is typically applied when polymer stamp 10 has been pressed into layer 14 with a suitable alignment between polymer stamp 10 and substrate 12. When exposed to this radiation 19, solidification of the moldable material is initiated, for solidification to a solid body 14' taking the shape determined by the polymer stamp 10. During the step of exposing layer 14 to radiation, heater 20 is controlled by the temperature controller to maintain the temperature of layer 14 at temperature $T_p$.

After exposure to radiation, a postbaking step is performed, to completely harden the material of layer 14'. In this step, heater device 20 is used to provide heat to layer 14', for baking layer 14' to a hardened body before separation of polymer stamp 10 and substrate 12. Furthermore, postbaking is performed by maintaining the aforementioned temperature $T_p$. This way, polymer stamp 10 and material layer 14, 14' will maintain the same temperature from the beginning of solidification of material 14 by exposure to radiation, to finalized postbaking, and optionally also through separation of polymer stamp 10 and substrate 12. This way, accuracy limitations due to differences in thermal expansion in any of the materials used for the substrate and the polymer stamp are eliminated.

The polymer stamp 10 is e.g. removed by a peeling and pulling process, as illustrated in FIG. 7, which process is simplified thanks to the COC material selection according to the invention. The formed and solidified polymer layer 14' remains on the substrate 12. The various different ways of further processing of the substrate and its layer 14' will not be dealt with here in any detail, since the invention as such is neither related to such further processing, nor is it dependent on how such further processing is achieved. Generally speaking, further processing for transferring the pattern of polymer stamp 10 to the substrate base 13 may e.g. include etching or plating followed by a lift-off step.

Figure 8:
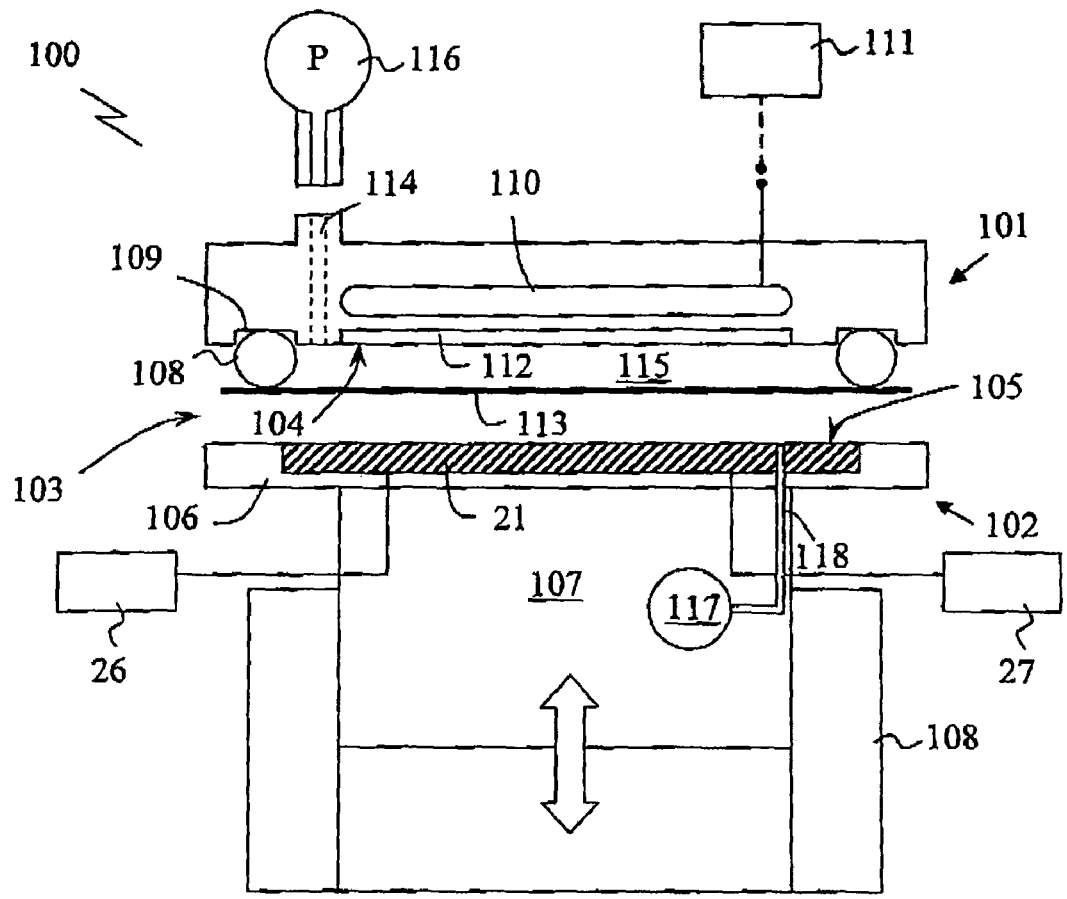
FIG. 8 schematically illustrates an embodiment of an apparatus according to the invention, for performing the process as generally described in FIG. 1-3 or 5-7.

FIG. 8 schematically illustrates a preferred embodiment of an apparatus according to the present invention, also usable for carrying out an embodiment of the method according to the present invention. It should be noted that this drawing is purely schematic, for the purpose of clarifying the different features thereof. In particular, dimensions of the different features are not on a common scale. The apparatus is particularly useful for carrying out the secondary step of the present invention, but may equally well be used for carrying out the primary step.

The apparatus 100 comprises a first main part 101 and a second main part 102. In the illustrated preferred embodiment these main parts are arranged with the first main part 101 on top of second main par; with an adjustable spacing 103 between said main parts. When making a surface imprint by a process as illustrated in FIGS. 5-7, it may be of great importance that the template and the substrate are properly aligned in the lateral direction, typically called the X-Y plane. This is particularly important if the imprint is to be made on top of or adjacent to a previously existing pattern in the substrate. However, the specific problems of alignment, and different ways of overcoming them, are not addressed herein, but may of course be combined with the present invention when needed.

The first, upper, main part 101 has a downwards facing surface 104, and the second, lower, main part 102 has an upwards facing surface 105. Upwards facing surface 105 is, or has a portion that is, substantially flat, and which is placed on or forms part of a plate 106 which acts as a support structure for a template or a substrate to be used in an imprint process, as will be more thoroughly described in conjunction with FIGS. 9 and 10. A heater body 21 is placed in contact with plate 106, or forms part of plate 106. Heater body 21 forms part of a heater device 20, and includes a heating element 22 and preferably also a cooling element 24, as shown in FIGS. 5-7. Heating element 22 is connected through connectors 23 to a energy source 26, e.g. an electrical power supply with current control means. Furthermore, cooling element 24 is connected through connectors 25 to a cooling source 27, e.g. a cooling fluid reservoir and pump, with control means for controlling flow and temperature of the cooling fluid.

Means for adjusting spacing 103 are, in the illustrated embodiment, provided by a piston member 107 attached at its outer end to plate 106. Piston member 107 is displaceably linked to a cylinder member 108, which preferably is held in fixed relation to first main part 101. As is indicated by the arrow in the drawing, the means for adjusting spacing 103 are devised to displace second main part 102 closer to or farther from first main part 101, by means of a movement substantially perpendicular to the substantially flat surface 105, i.e. in the Z direction. Displacement may be achieved manually, but is preferably assisted by employing either a hydraulic or pneumatic arrangement. The illustrated embodiment may be varied in a number of ways in this respect, for instance by instead attaching plate 106 to a cylinder member about a fixed piston member. It should further be noted that the displacement of second main part 102 is mainly employed for loading and unloading the apparatus 100 with a template and a substrate, and for arranging the apparatus in an initial operation position. The movement of second main part 102 is, however, preferably not included in the actual imprint process as such in the illustrated embodiment, as will be described.

First main part 101 comprises a peripheral seal member 108, which encircles surface 104. Preferably, seal member 108 is an endless seal such as an o-ring, but may alternatively be composed of several interconnected seal members which together form a continuous seal 108. Seal member 108 is disposed in a recess 109 outwardly of surface 104, and is preferably detachable from said recess. The apparatus further comprises a radiation source 110, in the illustrated embodiment disposed in the first main part 101 behind surface 104. Radiation source 110 is connectable to a radiation source driver 111, which preferably comprises or is connected to a power source (not shown), Radiation source driver 111 may be included in the apparatus 100, or be an external connectable member. A surface portion 112 of surface 104, disposed adjacent to radiation source 110, is formed in a material which is transparent to radiation of a certain wavelength or wavelength range of radiation source 110. This way, radiation emitted from radiation source 110 is transmitted towards spacing 103 between first main part 101 and second main part 102, through said surface portion 112. Surface portion 112, acting as a window, may be formed in available fused silica, quart, or sapphire.

One embodiment of the apparatus 100 according to the invention further comprises mechanical clamping means, for clamping together a substrate and a stamp (not shown). This is particularly preferred in an embodiment with an external alignment system for aligning substrate and stamp prior to pattern transfer, where the aligned stack comprising the stamp and the substrate has to be transferred into the imprint apparatus.

In operation, apparatus 100 is further provided with a flexible membrane 113, which is substantially flat and engages seal member 108. In a preferred embodiment, seal member 113 is a separate member from seal member 108, and is only engaged with seal member 108 by applying a counter pressure from surface 105 of plate 106, as will be explained.

However, in an alternative embodiment, membrane 113 is attached to seal member 108, e.g. by means of a cement, or by being an integral part of seal member 108. Furthermore, in such an alternative embodiment, membrane 113 may be firmly attached to main part 101, whereas seal 108 is disposed outwardly of membrane 113. For an embodiment such as the one illustrated, also membrane 113 is formed in a material which is transparent to radiation of a certain wavelength or wavelength range of radiation source 110. This way, radiation emitted from radiation source 110 is transmitted into spacing 103 through said cavity 115 and its boundary walls 104 and 113. Examples of usable materials for membrane 113, for the embodiment of FIGS. 7-9, include polycarbonate, polypropylene, polyethylene, PDMS and PEEK. The thickness of membrane 113 may typically be 10-500 µm.

The apparatus 100 further preferably comprises means for applying a vacuum between stamp and substrate in order to extract air inclusions from the moldable layer of the stacked sandwich prior to hardening of the layer through UV irradiation. This is exemplified in FIG. 8 by a vacuum pump 117, communicatively connected to the space between surface 105 and membrane 113 by a conduit 118.

A conduit 114 is formed in first main part 101 for allowing a fluid medium, either a gas, a liquid or a gel, to pass to a space defined by surface 104, seal member 108 and membrane 113, which space acts as a cavity 115 for said fluid medium. Conduit 114 is connectable to a pressure source 116, such as a pump, which may be an external or a built in part of apparatus 100. Pressure source 116 is devised to apply an adjustable pressure, in particular an overpressure, to a fluid medium contained in said cavity 115. An embodiment such as the one illustrated is suitable for use with a gaseous pressure medium. Preferably, said medium is selected from the group containing air, nitrogen, and argon. If instead a liquid medium is used, it is preferred to have the membrane attached to seal member 108. Such a liquid may be a hydraulic oil. Another possibility is to use a gel for said medium.

Figure 9:
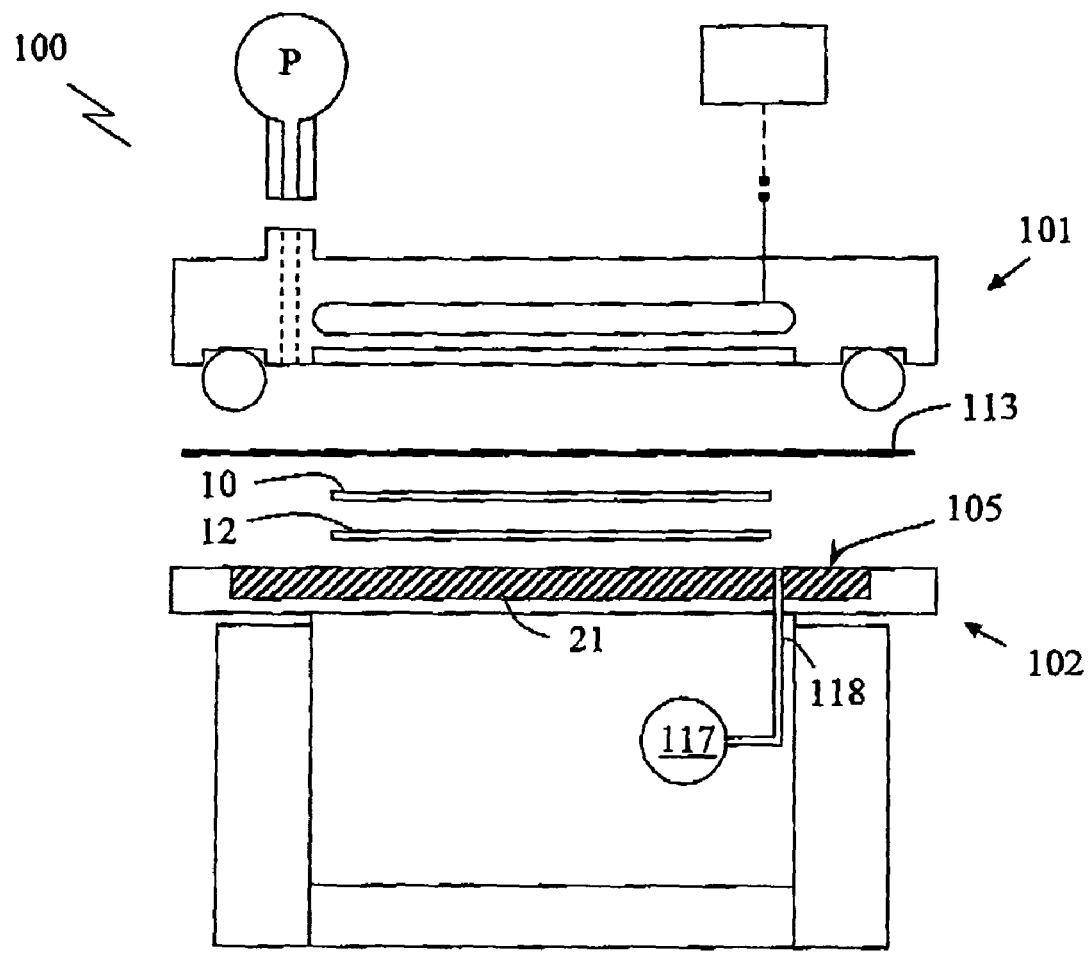
FIG. 9 schematically illustrates the apparatus of FIG. 8, when loaded with a polymer stamp and a substrate at an initial step of the process.

FIG. 9 illustrates the apparatus embodiment of FIG. 8, when being loaded with a substrate 12 and a polymer stamp 10 for a lithographic process. For better understanding of this drawing, reference is also made to FIGS. 5-7. Second main part 102 has been displaced downwards from first main part 101, for opening up spacing 103. The illustrated embodiment of FIG. 8 shows an apparatus loaded with a transparent polymer stamp 10 on top of a substrate 12. Substrate 12 is placed with a backside thereof on surface 105 of heater body 21, placed on or in the second main part 102. Thereby, substrate 12 has its target surface 17 with the layer 14 of a polymerizable material, e.g. a UV cross-linkable polymer solution, facing upwards. For the sake of simplicity, all features of heater device 20, as seen in FIGS. 5-7 are not shown in FIG. 9. Polymer stamp 10 is placed on or adjacent to substrate 12, with its structured surface 11 facing substrate 12. Means for aligning polymer stamp 10 with substrate 12 may be provided, but are not illustrated in this schematic drawing. Membrane 113 is then placed on top of polymer stamp 10. For an embodiment where membrane 113 is attached to the first main part, the step of actually placing membrane 113 on the polymer stamp is, of course, dispensed with. In FIG. 9 polymer stamp 10, substrate 12 and membrane 113 are shown completely separated for the sake of clarity only, whereas in a real situation they would be stacked on surface 105.

Figure 10:
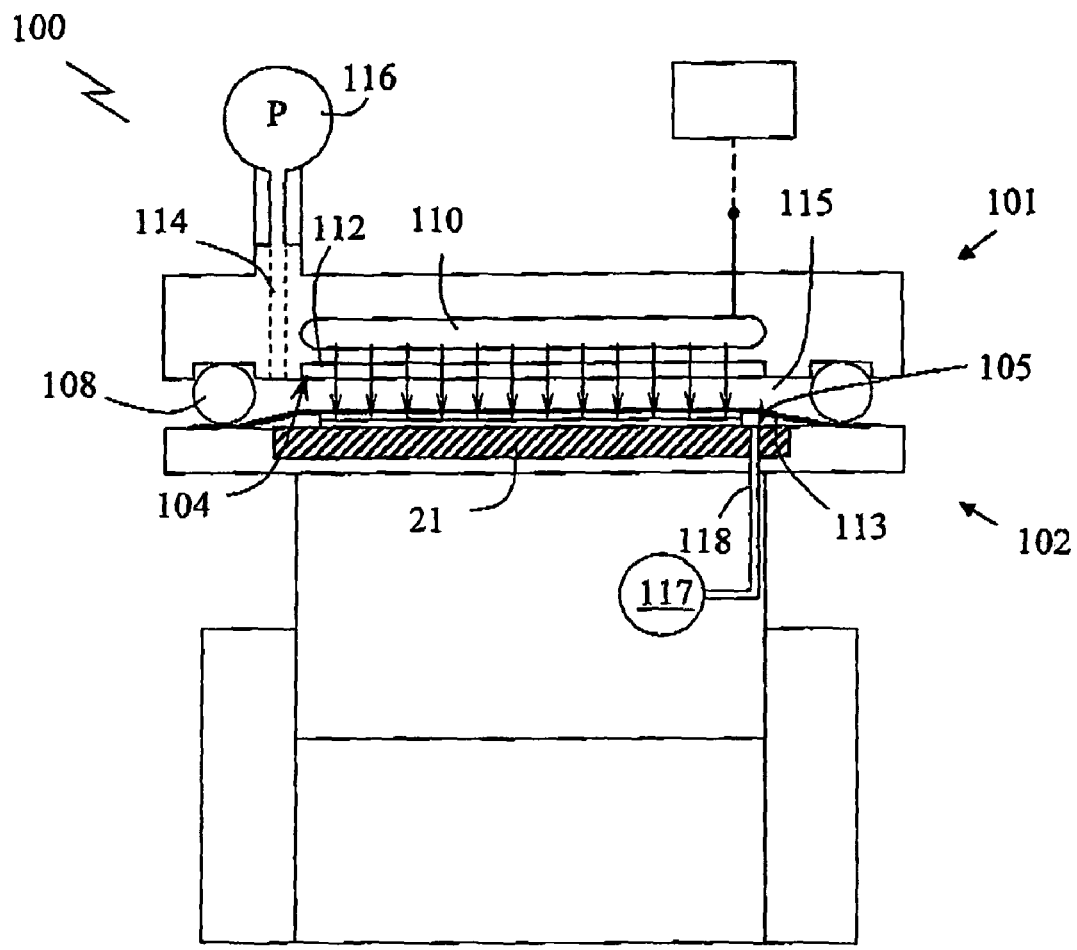
FIG. 10 illustrates the apparatus of FIGS. 8 and 9, at an active process step of transferring a pattern from the template to the substrate.

FIG. 10 illustrates an operative position of apparatus 100. Second main part 102 has been raised to a position where membrane 113 is clamped between seal member 108 and surface 105. In reality, both polymer stamp 10 and substrate 12 are very thin, typically only parts of a millimeter, and the actual bending of membrane 113 as illustrated is minimal. Still, surface 105 may optionally be devised with a raised peripheral portion at the point where it contacts seal member 108 through membrane 113, for compensating for the combined thickness of polymer stamp 10 and substrate 12.

Once main parts 101 and 102 are engaged to clamp membrane 113, cavity 115 is sealed. Vacuum is applied by suction from vacuum pump 117 to extract air inclusions from the surface layer of the substrate 12. Pressure source 116 is then devised to apply an overpressure to a fluid medium in cavity 115, which may be a gas, a liquid or a gel. The pressure in cavity 115 is transferred by membrane 113 to polymer stamp 10, which is pressed towards substrate 12 for imprinting the polymer stamp pattern in layer 14, cf. FIG. 6. Cross-linkable polymer solutions typically need pre-heating to overcome its glass transition temperature $T_g$, which may be about 60° C. An example of such a polymer is the afore mr-L6000.1 XP. When using such polymers, the apparatus 100, having combined radiation and heating capabilities, is particularly useful. However, for both these types of materials a post-baking step is generally needed to harden the radiation-solidified layer 14'. As previously mentioned, an aspect of the invention is therefore to apply a raised temperature $T_p$ to the material of layer 14, which is higher than $T_g$ for the case of a cross-linkable material, and also suitable for postbaking of the radiation-exposed material. Heater device 20 is activated to heat layer 14 through substrate 12, by means of heater body 21, until $T_p$ has been reached. The actual value of $T_p$ is naturally dependent on the material chosen for layer 14. For the example of mr-L6000.1 XP, a temperature $T_p$ within the range of 50-150° C. may be used, dependent on the molecular weight distribution in the material. The pressure of the medium in cavity 115 is then increased to 5-500 bar, advantageously to 5-200 bar, and preferably to 20-100 bar. Polymer stamp 10 and substrate 12 are thereby pressed together with a corresponding pressure, Thanks to flexible membrane 113, an absolutely even distribution of force is obtained over the whole of the contact surface between the substrate and the polymer stamp. The polymer stamp and the substrate are thereby made to arrange themselves absolutely parallel in relation to one another and, the influence of any irregularities in the surface of the substrate or polymer stamp being eliminated.

When polymer stamp 10 and substrate 12 have been brought together by means of the applied fluid medium pressure, radiation source is triggered to emit radiation 19. The radiation is transmitted through surface portion 112, which acts as a window, through cavity 115, membrane 113, and polymer stamp 10. The radiation is partly or completely absorbed in layer 14, the material of which thereby is solidified by cross-linking or curing in the perfectly parallel arrangement between polymer stamp 10 and substrate 12, provided by the pressure and membrane assisted compression. Radiation exposure time is dependent on the type and amount of material in layer 14, the radiation wavelength combined with the type of material, and of the radiation power. The feature of solidifying such a polymerizable material is well known as such, and the relevant combinations of the mentioned parameters are likewise known to the skilled person. Once the fluid has solidified to form a layer 14', further exposure has no major effect. However, after exposure the material of layer 14' is allowed to post bake, or hard bake, at the predetermined constant temperature $T_p$ for a certain time period of e.g. 1-10 minutes, if postbaking is at all necessary to solidify the layer. For the example of mr-L6000.1 XP, postbaking is typically performed for 1-10 minutes, preferably about 3 minutes, at the common process temperature $T_p$ of 100-120° C., For SU8, the time of exposure to radiation is between 1 and 10 seconds, where the range of 3-5 seconds has been successfully tested, and postbaking is then performed at a $T_p$ of about 70° C. for 30-60 seconds.

With the apparatus 100 according to the present invention, post-baking is performed in the imprint machine 100, which means that it is not necessary to bring the substrate out of the apparatus and into a separate oven. This saves one process step, which makes both time and cost savings possible in the imprint process. By performing the post-baking step while the polymer stamp 10 is still held at a constant temperature $T_p$, and potentially also with the selected pressure towards substrate 10, and, higher accuracy in the resulting structure pattern in layer 14 is also achieved, which makes it possible to produce finer structures. Following compression, exposure and post-baking, the pressure in cavity 115 is reduced and the two main parts 101 and 102 are separated from one another. After this, the substrate is separated from the polymer stamp and subjected to further treatment according to what is previously known for imprint lithography.

A first mode of the invention involves a substrate 12 of silicon covered by a layer 14 of NIP-K17 with a thickness of 1 μm. After compression by means of membrane 113 with a pressure of 5-100 bar for about 30 seconds, radiation source 110 is turned on. Radiation source 110 is typically devised to emit at least in the ultraviolet region below 400 nm. In a preferred embodiment, an air-cooled xenon lamp with an emission spectrum ranging from 200-1000 nm is employed as the radiation source 110. The preferred xenon type radiation source 110 provides a radiation of 1-10 W/cm², and is devised to flash 1-5 μs pulses, with a pulse rate of 1-5 pulses per second. A window 112 of quartz is formed in surface 104 for passing through radiation. Exposure time is preferably between 1-30 seconds, for polymerizing fluid layer 14 into a solid layer 14', but may be up to 2 minutes.

Tests with mr-L6000.1 XP have been performed with about 1.8 W/cm² integrated from 200-1000 nm, with 1 minute exposure time, It should, in this context, be noted that the radiation used need not be restricted to a wavelength range within which the polymer applied in layer 14 solidifies, radiation outside that range may of course also be emitted from the radiation source used. After successful exposure and subsequent postbaking at a constant process temperature, second main part 102 is lowered to a position similar to that of FIG. 9, following which template 10 and substrate 12 are removed from the apparatus for separation and further processing of the substrate.

By the term constant temperature is meant substantially constant, meaning that even though a temperature controller is set to maintain a certain temperature, the actual temperature obtained will inevitably fluctuate to a certain extent. The stability of the constant temperature is mainly dependent on the accuracy of the temperature controller, and inertia of the entire setup. Furthermore, it is understood that even though the method according to the invention is usable for imprinting extremely fine structures down to single nanometers, a slight temperature variation will not have a major effect as long as the template is not too large. Assuming that the structures at the periphery of the template has a width x, and a reasonable spatial tolerance is a fraction of that width, such as y=x/10, then y becomes the parameter setting the temperature tolerance. In fact, it can easily be calculated which effect differences in thermal expansion will have, by applying the respective coefficients of thermal expansion for the materials of the template and substrate, the size, typically the radius, of the template, and the spatial tolerance parameter y. From such a calculation, a suitable temperature tolerance for the temperature controller can be calculated and applied to the machine for performing the process.

Advantages of the application of flexible polymer foils within a "two-step" imprint process as described above and displayed in FIG. 1 include the following:

The flexible properties of the used polymer foils alleviate complications of the pattern transfer due to different thermal expansion coefficients of the applied stamp and substrate materials used in the imprint-process. Therefore, the technique offers possibilities to transfer patterns between surfaces of materials characterized by different thermal expansion coefficients. Nevertheless, most polymers used in the application are characterized by quite similar thermal expansion factors typically ranging between 60 and $70\times10^{-6}$ $C^{-1}$ making imprints between two different polymer foils as displayed in FIG. 1e) more easy in terms of manufacturing.

The flexible and ductile properties of the used polymer foils prevent the inclusion of air during the imprint between the polymer foil—hang either a patterned or non-patterned surface—and the other object—e.g. a substrate covered by a polymer film or a template, comprising silicon, nickel, quartz or a polymer material. If the foil is pressed towards one of these objects as displayed in FIG. 1b, 1e. 1h the polymer foil is acting like a membrane, pressing the air from the centre of the imprinted area to its edges where it can leave the imprinted region.

Due to the softness of the used polymer foils particles between the polymer foil and the template or object to which it is pressed, as well as pronounced surface roughness of the template or object, evident damages during an imprint process displayed in FIG. 1b), 1e) and 1h) of either the polymer foil or of one of the involved objects will be prevented.

Due to the high transparency of the used COC polymer foils to e.g. UV-radiation, also UV-curable polymers can be used during the imprint process described above, even when non-transparent templates and substrates are used.

The low surface tension of the COC polymer foil falls between the surface tension of a SAM template anti-adhesion layer, and the surface tension of many resist materials, particularly negative resists which a UV cross-linkable, making it ideal to apply them in a two step imprint process. The deposition of additional anti-adhesion layers on low surface tension polymers is in the most cases not necessary making the process described above simple and industrially applicable. Clearly spoken, it is possible to make the polymer replica stamp in an anti-adhesive material.

The process described above and displayed in FIG. 1 is very suitable to produce both positive (the pattern is similar to that of the original template) and negative (the pattern is inverted to that of the original template) replicas if the material properties of the different polymer materials—e.g. glass transition temperature, optical transparency, and curability after exposure to radiation—applied in the process are adapted to each other.

The aging and wear resistance of the used flexible polymer stamps make it possible to apply them several times in the secondary step of the imprint process. Alternatively, the polymer stamps are used only once and are then thrown away. In any case, this enhances the lifetime of the original template 1, which never has to be used for imprint against a hard and non-flexible material.

The flexible and ductile properties of the used polymer foils alleviate demolding of the inflexible stamp or substrate from the flexible foil reducing physical damages on the stamp or the substrate.

Instead of mechanical demolding of the polymer foil from a substrate after performed imprint the polymer foil can alternatively be chemically dissolved with the help of a suitable solvent. This procedure would be preferred in case of a transfer of patterns having high aspect ratios, i.e. where the depth of a pattern structure is substantially larger than its width, were mechanical demolding could damage the substrate or the stamp.

Not only the pattern on the surface of an original template but also the physical dimension of the original template can easily be transferred into a polymer foil. In some applications the placement of the pattern on the final substrate is critical. For e.g. hard disk drives the pattern should be replicated and aligned to the centre of the disk. Here, the master stamp can be produced with a centre hole. After imprint a relief of the centre hole is formed into the flexible polymer foil, which can be used for aligning the pattern on the foil to the final replicated disk.

A replica generated in a polymer sheet can give access to a novel family development process, which is not executable the common way by nickel-to-nickel plating. Here, the imprinted polymer sheet is first bonded together with a rigid substrate by, e.g., a UV-assisted imprint process. Thereafter the sheet is metallized with a seed layer and electroplated to receive a nickel copy of the original, Many other conversion processes are accessible via the described invention.

EXAMPLES

As a master template, a metal template provided with a SAM anti-adhesion layer has been used. The template is preferably made of nickel, although alternative embodiments may be made of e.g. vanadium, aluminium, tantalum, niobium, zirconium, or titanium. The anti-adhesive layer comprises a fluorinated alkyl phosphoric acid derivative or a fluorinated alkyl poly-phosphoric acid derivative, including a phosphorous atom and an alkyl chain. Details of how such an anti-adhesion layer may be composed, and how it is provided on the template surface, is documented in WO 2005/119360, which is hereby incorporated herein by reference. As an alternative to such an anti-adhesion layer, a layer comprising silane groups, phosphate groups and carboxylic groups may be used. Embodiments of such anti-adhesion layers are documented in WO 2004/000567, which is also incorporated herein by reference.

Some COC polymer foils which have been used are:

Topas 8007 from Ticona GmBH, Germany; thermoplastic random co-polymer having a glass temperature of 80° C. Topas is transparent to light with wavelengths above 300 nm and is characterized by a low surface tension. The foil is available in thicknesses of 50-500 µm. 130-140 µm thick foils have been used here.

Zeonor ZF14 from Zeon Chemicals, Japan: thermoplastic polymer having a glass temperature of 136° C. and a light transmittance of 92% for wavelengths above 300 nm. The used foil has a thickness of 188 µm but is available in other thicknesses ranging from 50 to 500 µm.

Zeonex E48R from Zeon Chemicals, Japan: thermoplastic polymer having a glass temperature of 139° C. and a light transmittance of 92% for wavelength above 350 nm. The used foil has a thickness of 75 µm.

The surface tension or energy for these materials is typically in the range of 30-37 mN/nm.

A resist material which has been successfully used in the secondary step is SU8 from MicroChem Corp. USA, a photoresist material, curable after exposure to light having wavelengths between 350 and 400 nm. SU8 has a surface tension of about 45 mN/m. As an adhesion promoter between the SU8 film and the silicon substrate a thin LOR0.7 film from MicroChem Corp. USA has been used.

Example 1

Figure 2:
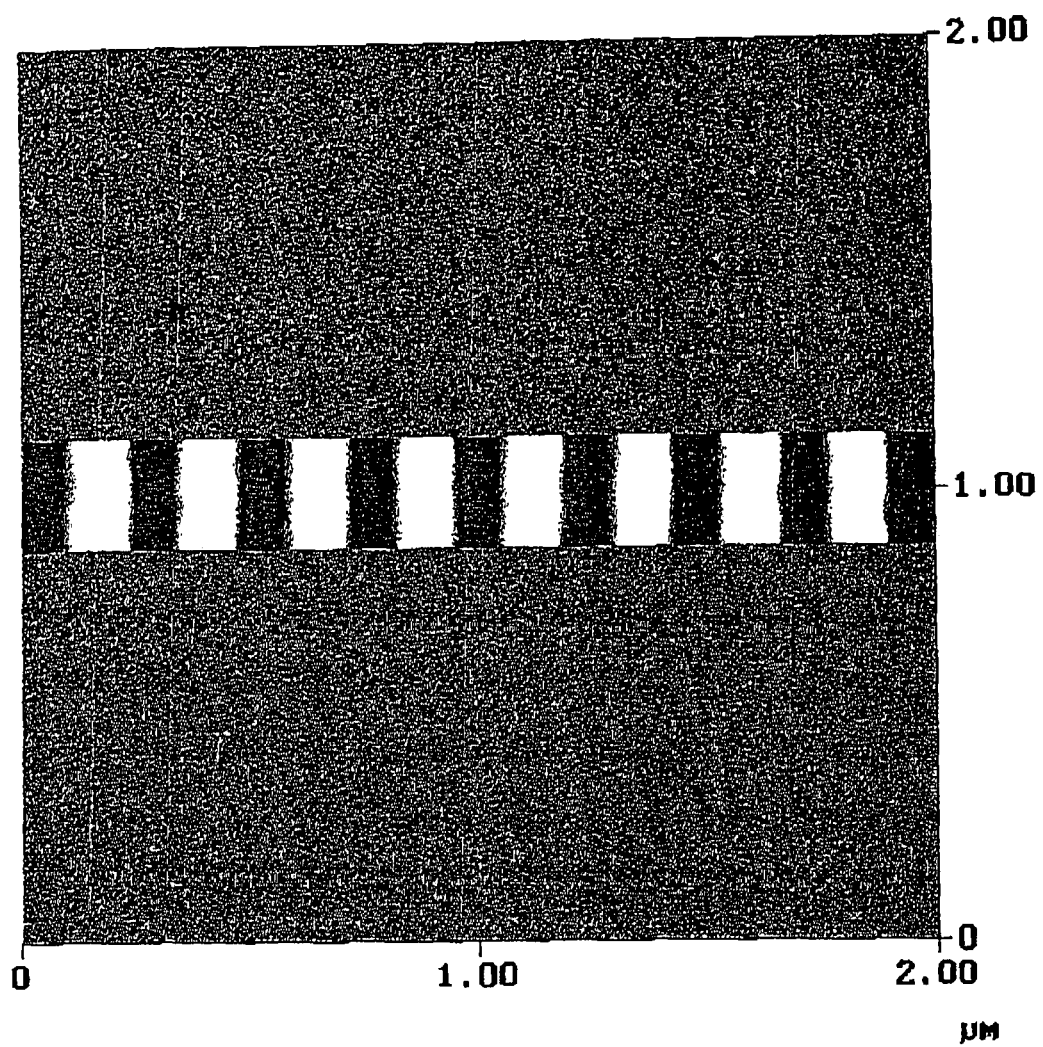
FIG. 2 shows an AFM tapping mode image of a line pattern, imprinted in SU8 by means of a method according to an embodiment of the invention.

A nickel template whose surface exhibits a line pattern, having a line width of 80 nm and a height of 90 nm has been imprinted into a Zeonor ZF14 foil at 150° C. and 50 bar for 3 min. The Ni surface was pre-treated with a fluorinated SAM anti-adhesion layer, to obtain a low surface tension of less than 20 mN/m, preferably less than 18 mN. The Zeonor foil was mechanically removed from the template surface without damaging the pattern of neither the template nor the replica. The Zeonor foil has been used as a new template, which has been imprinted into a 100 nm thick SU8 film. The SU8 film was spin-coated onto a 20 nm LOR film, previously spin-coated onto a silicon substrate. None of the surfaces were treated by an additional coating, having the purpose to improve the anti-adhesion behavior between the SU8 film and the Zeonor foil. The imprint was performed at 70° C. and 50 bar for 3 min. The SU8 film was exposed to UV-light for 4 seconds through the optically transparent Zeonor foil and baked for two more minutes. Both temperature and pressure were kept constant at 70° C. and 50 bar, respectively, during the entire imprint sequence. The release temperature was 70° C. at which the Zeonor foil could mechanically be removed from the SU8 film without damaging the pattern of neither the polymer template foil nor the replica film. FIG. 2 shows an AFM image of an imprint result in an SU8 film deposited on a silicon wafer, manufactured by the process above, but without an anti-adhesion layer on the Ni stamp. Still, it is evident that the fine pattern may be reproduced using an intermediate COC polymer stamp.

Example 2

Figure 3:
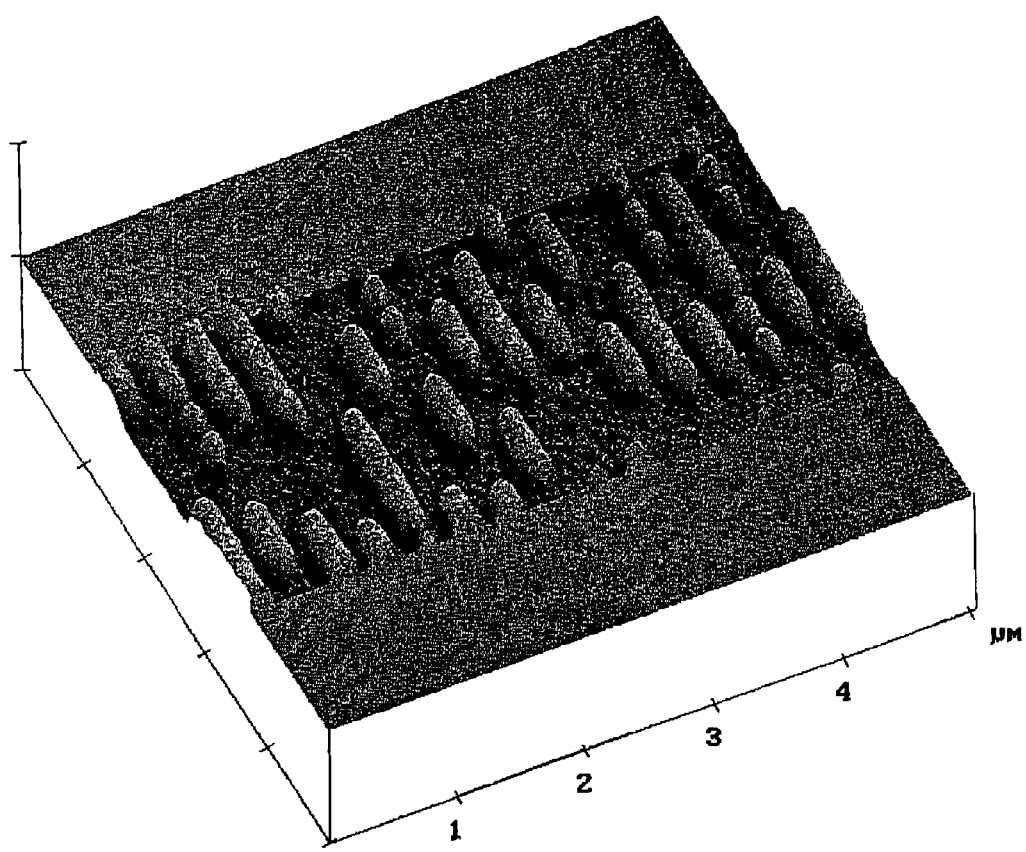
FIG. 3 shows an AFM tapping mode image of a BluRay optical disk pattern, imprinted in SU8 according to an embodiment of the invention.

A nickel template whose surface exhibits a BluRay pattern having structure heights of 100 nm and widths of 150 nm—investigated by AFM—has been imprinted into a Zeonor ZF14 using the same process and the same parameters as already described in Example 1. The Zeonor foil has been used as a new template, which has been imprinted into a 100 nm thick SU8 film. Also here the same process and the same parameters as already described in Example 1 have been used. The AFM image of an imprint result in the SU8 film deposited on a silicon wafer is shown in FIG. 3.

Example 3

Figure 4:
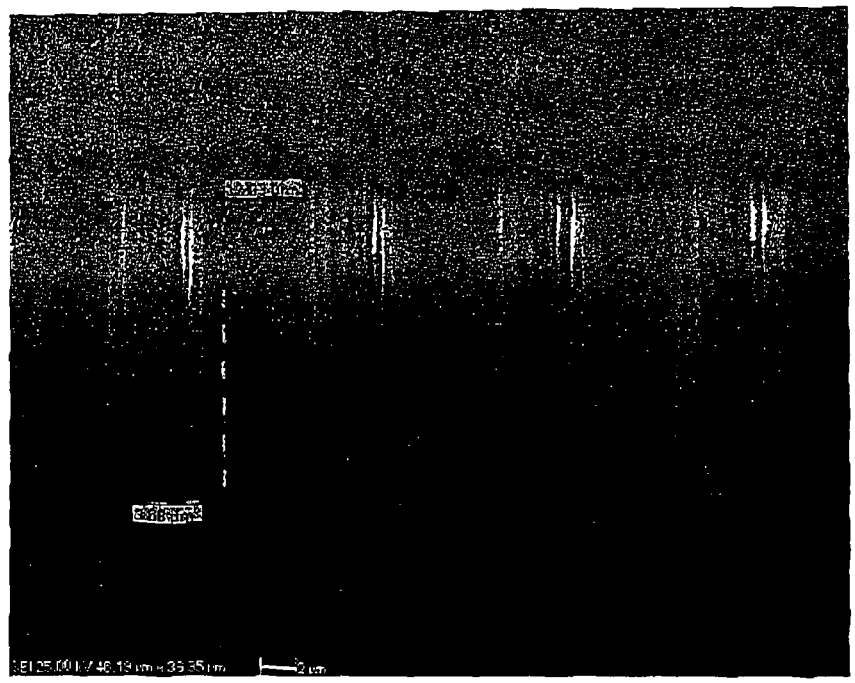
FIG. 4 shows SEM images of a pillar pattern having micrometer dimensions with high aspect-ratios, provided by imprint in accordance with an embodiment of the invention.
Figure 4:

A nickel template has been used whose surface contains micro-meter patterns with high aspect-ratios ranging from 1-28. The feature size ranges from 600 nm to 12 µm, at a height of 17 µm. The surface has been covered by a phosphate-based anti-adhesion film before the imprint. The nickel template has been imprinted into a polycarbonate foil at 190° C. and 50 bar for 3 min. The surface of the polycarbonate foil has not been treated by an additional coating, having the purpose to improve the anti-adhesion behavior between the Ni template and the polycarbonate film. The release temperature was 130° C., at which the polycarbonate foil could mechanically be removed from the nickel surface without damaging the pattern of neither the template nor the replica. The polycarbonate foil has been used as a new template for an imprint into a Topas foil. The imprint has been performed at 120° C. and 50 bar for 3 min. None of the surfaces has been disposed by an additional coating, having the purpose to improve the anti-adhesion behavior between the polycarbonate and the Topas foil. The release temperature was 70° C., at which the Topas could mechanically be removed from the polycarbonate foil without damaging the pattern of neither the template foil nor the replica foil. The Topas foil has then been used as a new template, which has been imprinted into a 6000 nm thick SU8 film spin-coated onto a silicon substrate. Also here, none of the surfaces has been treated by any additional coating, having the purpose to improve the anti-adhesion behavior between the SU8 film and the Topas foil. The imprint was performed at 70° C. and 50 bar for 3 min. The SU8 film was exposed to UV-light for 4 seconds through the optically transparent Topas foil and baked for two more minutes without changing the temperature of 70° C., or the pressure of 50 bar during the entire process. The release temperature was 70° C. Afterwards the Topas foil has completely been dissolved in p-xylene at 60° C. for one hour. An SEM image of the result is shown in FIG. 4.

Experimental

The Imprint processes given in the examples above have been performed with differently patterned Ni stamps, in some cases covered by phosphate-based anti-adhesion films, using different process parameters. The substrates (2 to 6 inch silicon wafers) have been cleaned by rinsing with isopropanol and acetone directly before spinning the LOR and the SU8 films. The sizes of the applied stamps are 2 to 6 inches. The imprints have been carried out using an Obducat-6-inch-NIL equipment, provided with an UV-module.

Atomic force microscopy (AFM) in the tapping mode with the help of a NanoScope IIIa microscope from Digital Instruments was carried out to investigate both the imprint results and the stamps after performed imprint.

Scanning Electron Microscopy (SEM) has been performed using a Obducat CamScan MX2600 Microscope at 25 kV.

The foregoing has described, both in general terms and by means of specific detailed examples, an invention concerning a two-step imprint process, where a polymer stamp of COC material is first formed and then used. The scope of protection sought is defined in the appended claims.

The invention claimed is:

1. A method of use of a moldable polymer stamp composition, the composition comprising one or more Cyclic Olefin Copolymers (COCs) as a constituent of a polymer foil having a surface on which a structured pattern is formed for use in an imprint process, comprising the steps of:
   contacting a pattern of a surface of a template with a polymer material comprising the one or more Cyclic Olefin Copolymers (COCs) to produce a flexible polymer replica having a structured surface with an inverse of the pattern of the template surface;
   releasing the flexible polymer replica from the template surface; and
   pressing the inverse pattern of the flexible polymer replica into a surface of an object, to imprint a replica of the pattern of the template surface in the surface of the object;
   wherein a surface tension of the template surface ($\sigma_{solid}$, template material) is lower than a surface tension of the polymer foil in the liquid state ($\sigma_{liquid}$, polymer material), and further wherein a surface tension of the polymer foil in the solid state ($\sigma_{solid}$, polymer foil) is lower than a surface tension of the surface of the object ($\sigma_{liquid}$, resist material).

2. The method as recited in claim 1, wherein the COCs polymer foil has a surface tension between about 28 mN/m and about 40 mN/m.

3. The method as recited in claim 1, wherein the COCs polymer foil has a surface tension between about 28 mN/m and about 37 mN/m.

4. The method as recited in claim 1, wherein the COCs polymer foil has a surface tension between about 30 mN/m and about 35 mN/m.

5. The method as recited in claim 1, wherein the COCs polymer foil has a thickness of about 50 µm to about 1 mm.

6. The method as recited in claim 1, wherein the COCs polymer foil has a thickness of about 75 µm to about 250 µm.

7. The method as recited in claim 1, wherein the COCs polymer foil has a glass transition temperature between about 100° C. and about 250° C.

8. The method as recited in claim 1, wherein the COCs polymer material is a copolymer based on cyclic monomers and ethane.

9. The method as recited in claim 8, wherein the COCs polymer material is a copolymer based on: 8,9,10-trinorborn-2-ene (norbornene) or 1,2,3,4,4a,5,8,8a-octahydro-1,4:5,8-dimethanonaphthalene (tetracyclododecene), with ethane.

10. The method as recited in claim 1, wherein the flexible polymer replica has a surface tension between about 28 mN/m and about 40 mN/m.

11. The method as recited in claim 1, wherein the flexible polymer replica has a surface tension between about 28 mN/m and about 37 mN/m.

12. The method as recited in claim 1, wherein the flexible polymer replica has a surface tension between about 30 mN/m and about 35 mN/m.

13. The method as recited in claim 8, wherein the COCs polymer material is a copolymer based on: 8,9,10-trinorborn-2-ene (norbornene) or 1,2,3,4,4a,5,8,8a-octahydro-1,4:5,8-dimethanonaphthalene (tetracyclododecene) with ethane.

14. The method as recited in claim 1, wherein the template is made from a polymer, a metal, quartz, or silicon.

15. The method as recited in claim 1, wherein the template surface is provided with an anti-adhesion layer having a surface tension which is lower than a surface tension of the polymer replica.

16. The method as recited in claim 1, wherein the template surface is provided with an anti-adhesion layer having a surface tension of about 20 mN/m or less.

17. The method as recited in claim 1, wherein the template surface is provided with an anti-adhesion layer having a surface tension of about 18 mN/m or less.

18. The method as recited in claim 1, wherein the template surface is provided with a Self-Assembled Monolayer (SAM) as an anti-adhesion layer.

19. The method as recited in claim 1, wherein the template surface is provided with a Self-Assembled Monolayer (SAM) as an anti-adhesion layer, the SAM comprising fluorinated alkyl phosphoric acids, fluorinated alkyl poly-phosphoric acid derivatives, polytetrafluoroethylene (PTFE), or fluorinated alkyl silanes.

20. The method as recited in claim 1, wherein the object is a substrate having a resist material layer at the surface of the object.

21. The method as recited in claim 1, wherein the object is a substrate having a resist material layer at the surface of the object, the resist material having a surface tension of greater than about 40 mN/m.

22. The method as recited in claim 1, wherein the object is a substrate having a resist material layer at the surface of the object, wherein the resist layer is a radiation cross-linkable material, the method further comprising:

flooding the resist material with ultraviolet (UV) light through the flexible polymer replica to cross-link the resist material layer.

23. The method as recited in claim 1, wherein the flexible polymer replica is produced by an injection molding process, the process comprising:

positioning the template on a first support member;

positioning a second support member at a distance from the first support member with a spacing between the second support surface and the structured surface of the template;

heating the polymer material comprising one or more COCs to a liquid state;

injecting the liquid COCs polymer material in the spacing under pressure; and solidifying the polymer material to produce the flexible polymer replica having the structured surface with an inverse of the pattern of the template surface.

24. The method as recited in claim 1, wherein the object is a semiconductor material.

25. The method as recited in claim 1, wherein the flexible polymer replica has a thickness of about 50 μm to about 1 mm.

26. The method as recited in claim 1, wherein the flexible polymer replica has a thickness of about 75 μm to about 250 μm.

27. The method as recited in claim 1, wherein the flexible polymer replica has a glass transition temperature between about 100° C. and about 250° C.

* * * * *